(12) United States Patent
Watanabe et al.

(10) Patent No.: US 8,541,934 B2
(45) Date of Patent: Sep. 24, 2013

(54) DISPLAY DEVICE

(75) Inventors: Hisashi Watanabe, Osaka (JP); Yasushi Asaoka, Osaka (JP)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 13/265,157

(22) PCT Filed: Apr. 20, 2010

(86) PCT No.: PCT/JP2010/002845
§ 371 (c)(1),
(2), (4) Date: Oct. 19, 2011

(87) PCT Pub. No.: WO2010/122781
PCT Pub. Date: Oct. 28, 2010

(65) Prior Publication Data
US 2012/0049718 A1 Mar. 1, 2012

(30) Foreign Application Priority Data
Apr. 21, 2009 (JP) ................................. 2009-103440

(51) Int. Cl.
*H01J 5/16* (2006.01)
(52) U.S. Cl.
USPC ........................... 313/110; 362/317; 313/504
(58) Field of Classification Search
USPC ............... 257/40, 72, 98–100, 642–643, 759; 313/498–512, 110–117; 315/169.1, 169.3; 427/58, 64, 66, 532–535, 539; 428/690–691, 428/917; 438/26–29, 34, 82, 455; 445/24–25; 362/543–549, 555, 800, 249.01–249.03, 362/362, 317, 326, 339; 349/56, 58, 61, 349/62, 69, 95, 57
See application file for complete search history.

(56) References Cited

U.S. PATENT DOCUMENTS

| 5,656,893 A | 8/1997 | Shino et al. |
| 5,969,478 A | 10/1999 | Shino et al. |

(Continued)

FOREIGN PATENT DOCUMENTS

| EP | 0 680 067 A2 | 11/1995 |
| JP | 63-061886 U | 4/1988 |

(Continued)

OTHER PUBLICATIONS

Official Communication issued in International Patent Application No. PCT/JP2010/002845, mailed on May 25, 2010.

(Continued)

*Primary Examiner* — Donald Raleigh
(74) *Attorney, Agent, or Firm* — Keating & Bennett, LLP

(57) ABSTRACT

A direct-viewing type display device (100A) of the present invention includes: a display panel which has a display region (10A) that can be altered into a transparent state and a frame region (10F) provided outside the display region; and a light-transmitting cover (20) provided on a front side of the display panel. The light-transmitting cover includes a lens portion (22) positioned so as to overlap a region that includes part of the frame region of the display panel and part of a peripheral display region (10D) within the display region which adjoins the part of the frame region. The display device further includes a housing (30) which has a housing portion (36) provided at least on a side surface (10b) of the display panel. Part of light going out from the part of the peripheral display region and/or part of light entering the housing portion on a rear side goes out on a front side of the housing portion (36). In the display device of the present invention, the frame is visually obscured, and the display region can be altered into a transparent state.

10 Claims, 26 Drawing Sheets

(56) References Cited

U.S. PATENT DOCUMENTS

| | | | |
|---|---|---|---|
| 6,072,279 A | 6/2000 | Shino et al. | |
| 6,118,220 A | 9/2000 | Shino et al. | |
| 6,150,766 A | 11/2000 | Shino et al. | |
| 6,927,908 B2 | 8/2005 | Stark | |
| 2001/0019378 A1* | 9/2001 | Yamaguchi | 349/61 |
| 2004/0051944 A1 | 3/2004 | Stark | |
| 2004/0169786 A1* | 9/2004 | Yamazaki et al. | 349/61 |
| 2006/0001796 A1* | 1/2006 | Chang et al. | 349/95 |
| 2006/0146237 A1* | 7/2006 | Minoura et al. | 349/113 |
| 2008/0074575 A1* | 3/2008 | Wiemer et al. | 349/58 |
| 2009/0207327 A1* | 8/2009 | Terao et al. | 349/5 |
| 2010/0259566 A1 | 10/2010 | Watanabe | |
| 2011/0102302 A1 | 5/2011 | Watanabe et al. | |
| 2011/0109535 A1 | 5/2011 | Watanabe et al. | |
| 2011/0242686 A1 | 10/2011 | Watanabe | |

FOREIGN PATENT DOCUMENTS

| | | |
|---|---|---|
| JP | 05-188873 A | 7/1993 |
| JP | 08-063110 A | 3/1996 |
| JP | 2003-177683 A | 6/2003 |
| JP | 2004-524551 A | 8/2004 |
| JP | 2005-326757 A | 11/2005 |
| JP | 2006-276580 A | 10/2006 |
| JP | 2007-61446 A | 3/2007 |
| WO | 2008/149449 A1 | 12/2008 |

OTHER PUBLICATIONS

English translation of Official Communication issued in corresponding International Application PCT/JP2010/002845, mailed on Dec. 1, 2011.

Watanabe; "Display Device"; U.S. Appl. No. 13/147,371, filed Aug. 2, 2011.

Official Communication issued in corresponding European Patent Application No. 10738339.0, mailed on Aug. 21, 2012.

* cited by examiner (a)

(b)

(a)

(b)

(c)

(a)

(b)

(c)

(a)

(b)

DISPLAY DEVICE

TECHNICAL FIELD

The present invention relates to a display device and particularly to a direct-viewing type display device.

BACKGROUND ART

A liquid crystal display device includes a liquid crystal display panel, a backlight device, circuits for supplying various electrical signals to the liquid crystal display panel, and a power supply, as well as a housing for accommodating these components. The liquid crystal display panel has a display region in which a plurality of pixels are arrayed and a frame region surrounding the display region. In the display region, pixel electrodes and TFTs are provided. In the frame region, a sealing portion, an implementation of driving circuitry, etc., are provided. Since no pixels are arrayed in the frame region, the frame region does not contribute to displaying. The frame region of the existing liquid crystal display devices has been decreasing, although the frame region itself cannot be omitted in principle.

When constructing a large screen by arraying a plurality of display panels, joints will occur in an image displayed on the large screen because the frame regions of the display panels do not contribute to displaying. Patent Documents 1 and 2 disclose display devices which have a light-transmitting cover provided on the viewer's side of the display panel in order to display a jointless image. An edge portion of the light-transmitting cover includes a portion in which the viewer-side surface is curved. The curved portion functions as a lens, and therefore will be referred to as a "lens portion" hereinafter. The lens portion of the light-transmitting cover is provided so as to overlap the frame region of the display panel and a portion of a region of the display region adjoining the frame region. A portion of the display region that overlaps the lens portion will be referred to as a "peripheral display region". Light which goes out from pixels which are arrayed in the peripheral display region is refracted by the lens portion toward the frame region. As a result, an image is also displayed on the front face of the frame region, so that a jointless image is displayed on the entire screen.

Patent Document 3 discloses a display device which has a circular or oval shape.

CITATION LIST

Patent Literature

Patent Document 1: Japanese Laid-Open Patent Publication No. 5-188873
Patent Document 2: Japanese PCT National Phase Laid-Open Publication No. 2004-524551
Patent Document 3: Japanese Laid-Open Patent Publication No. 2006-276580

SUMMARY OF INVENTION

Technical Problem

The present inventor conducted research for a novel display device in which the frame is visually obscured.

When the light-transmitting cover having the lens portion which is disclosed in Patent Document 1 or 2 is positioned such that the lens portion extends over the frame region of the display panel, the frame region of the display panel is visually obscured. However, the display panel is contained in a housing, and accordingly, part of the housing is present outside the frame region of the display panel. Therefore, even when the frame region is visually obscured by means of the lens portion, part of the housing which is present outside the frame region is visually recognized. That is, part of the housing is seen as if it was a frame.

In view of such circumstances, the present inventor disclosed a display device in which a frame including a housing is visually obscured in Japanese Patent Application No. 2009-026783. The entire disclosure of Japanese Patent Application No. 2009-026783 is incorporated by reference in this specification.

One of the objects of the present invention is to provide a direct-viewing type display device in which the frame is visually obscured and in which the display region can be altered into a transparent state.

Solution to Problem

A display device of the present invention includes: a display panel which has a display region that can be altered into a transparent state and a frame region provided outside the display region; and at least one light-transmitting cover which includes a first light-transmitting cover provided on a front side of the display panel; wherein the first light-transmitting cover includes a lens portion positioned so as to overlap a region that includes part of the frame region of the display panel and part of a peripheral display region within the display region which adjoins the part of the frame region, the display device further includes a housing which has a housing portion provided at least on a side surface of the display panel, and part of light going out from the part of the peripheral display region and/or part of light entering the housing portion on a rear side goes out on a front side of the housing portion.

In one embodiment, the housing portion is capable of transmitting light, and an outer end surface of the housing portion is located at an outer position relative to an outer edge of the lens portion of the first light-transmitting cover.

In one embodiment, the lens portion of the first light-transmitting cover is arranged such that an outer edge of the lens portion is present on a front side of the outer end surface of the housing portion.

In one embodiment, the housing and the first light-transmitting cover are integrally formed.

In one embodiment, the housing and the first light-transmitting cover are integrally formed, and at least part of a front-side surface and a rear-side surface of the housing portion is a lens surface.

In one embodiment, the housing portion is provided such that the front-side surface of the housing portion and the front-side surface of the lens portion form a boundary therebetween, the boundary is located on a front side of the part of the frame region, and the front-side surface of the housing portion is a lens surface.

In one embodiment, the at least one light-transmitting cover further includes a second light-transmitting cover provided on a rear side of the display panel, the second light-transmitting cover includes a lens portion positioned so as to overlap a region that includes part of the frame region of the display panel and part of a peripheral display region within the display region which adjoins the part of the frame region, and part of light going out from the part of the peripheral display region and/or part of light entering the housing portion on the front side goes out on a rear side of the housing portion.

The first light-transmitting cover and the second light-transmitting cover are arranged generally symmetrically about the display panel. The first light-transmitting cover and the second light-transmitting cover have generally equal shapes.

In one embodiment, the display panel is a polymer-dispersed liquid crystal display panel.

In one embodiment, the display panel is an organic EL display panel.

Advantageous Effects of Invention

The present invention provides a direct-viewing type display device in which the frame is visually obscured and in which the display region can be altered into a transparent state.

BRIEF DESCRIPTION OF DRAWINGS

[FIG. 38] is a schematic cross-sectional view of an edge portion of the liquid crystal display device 500a.

DESCRIPTION OF EMBODIMENTS

Hereinafter, embodiments of the present invention will be described with reference to the drawings. The present invention is not limited to the embodiments which will be exemplified below.

Figure 1:
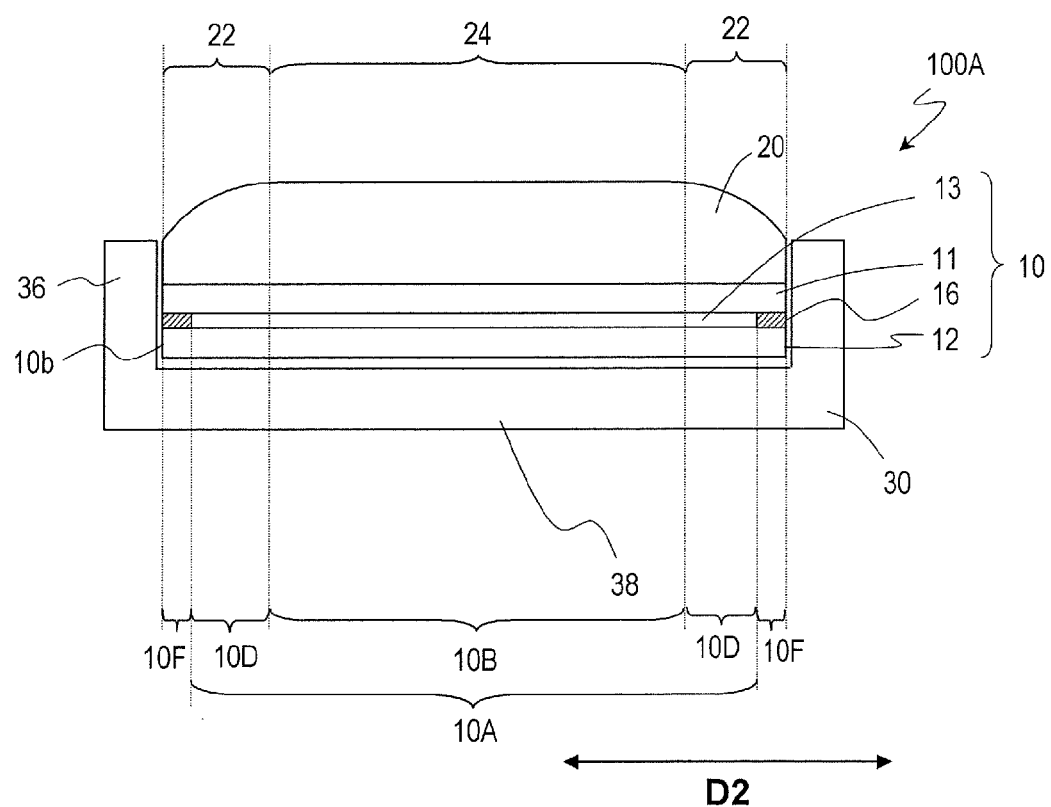
[FIG. 1] A schematic cross-sectional view of a liquid crystal display device 100A of an embodiment of the present invention.

FIG. 1 is a schematic cross-sectional view of a direct-viewing type liquid crystal display device 100A that is an embodiment of the present invention.

As shown in FIG. 1, the liquid crystal display device 100A includes a sole liquid crystal display panel 10, a light-transmitting cover 20 provided on the front side of the liquid crystal display panel 10, and a housing 30. Here, the "front side" has the same meaning as the "viewer's side". However, when the device is observable on both sides as is a liquid crystal display device of an embodiment which will be described later, one side is referred to as "front side", and the other side is referred to as "rear side". When the liquid crystal display device is provided in an electronic apparatus, the front side is determined depending on the mode of use of the electronic apparatus in some cases, although in general the front side and the rear side can be arbitrary.

The liquid crystal display panel 10 includes a display region 10A and frame regions 10F which are provided outside the display region 10A. The liquid crystal display panel 10 is a transmissive liquid crystal display panel which has a display region that can be altered into a transparent state. For example, a known scattering-type liquid crystal display panel which performs displaying with a scattering state and a transparent state, such as a polymer-dispersed liquid crystal display panel, can be used. Under the liquid crystal display panel 10, a backlight device may be provided as necessary. The configuration of the liquid crystal display panel 10 and the backlight device will be described later.

The light-transmitting cover 20 includes lens portions 22 and a flat portion 24. The lens portions 22 of the light-transmitting cover 20 are positioned so as to overlap regions which include the frame regions 10F of the liquid crystal display panel 10 and peripheral display regions 10D that are parts of the display region 10A adjoining the frame regions 10F. Light going out from the peripheral display regions 10D are refracted by the lens portions 22, whereby images formed in the peripheral display regions 10D are enlarged so as to be displayed over regions constituted of the peripheral display regions 10D and the frame regions 10F. Although the liquid crystal display panel 10 includes the frame regions 10F, the frame regions 10F can be visually obscured by providing the light-transmitting cover 20 that has the lens portions 22 on the front side of the liquid crystal display panel 10.

When the display region of the liquid crystal display panel 10 is in a transparent state, the frame regions 10F and the display region are visually obscured, so that these regions appear transparent for the viewer. By obscuring the entire frame regions, the entirety of the liquid crystal display panel 10 appears transparent for the viewer.

The housing 30 is provided to protect the liquid crystal display panel 10. Since the display device of the present embodiment includes the housing 30, the display panel is prevented from being exposed to dust or water. The display panel is also prevented from undergoing a direct impact. Hereinafter, part of the housing is referred to as "housing portion". The housing 30 includes lateral housing portions 36 and a bottom housing portion 38. The lateral housing portions 36 are capable of transmitting light and are provided on side surfaces 10b of the liquid crystal display panel 10. The bottom housing portion 38 is provided under the liquid crystal display panel 10.

Since the lateral housing portions 36 are capable of transmitting light, part of light entering the lateral housing portions 36 on their rear side goes out from the front side of the lateral housing portions 36. Therefore, the rear environment behind the lateral housing portions 36 is visible to the viewer therethrough. Thus, a display device can be realized in which the frame is visually obscured. When the display region of the liquid crystal display panel 10 is in a transparent state, the lateral housing portions 36, the frame regions 10F, and the display region appear transparent.

Figure 24:
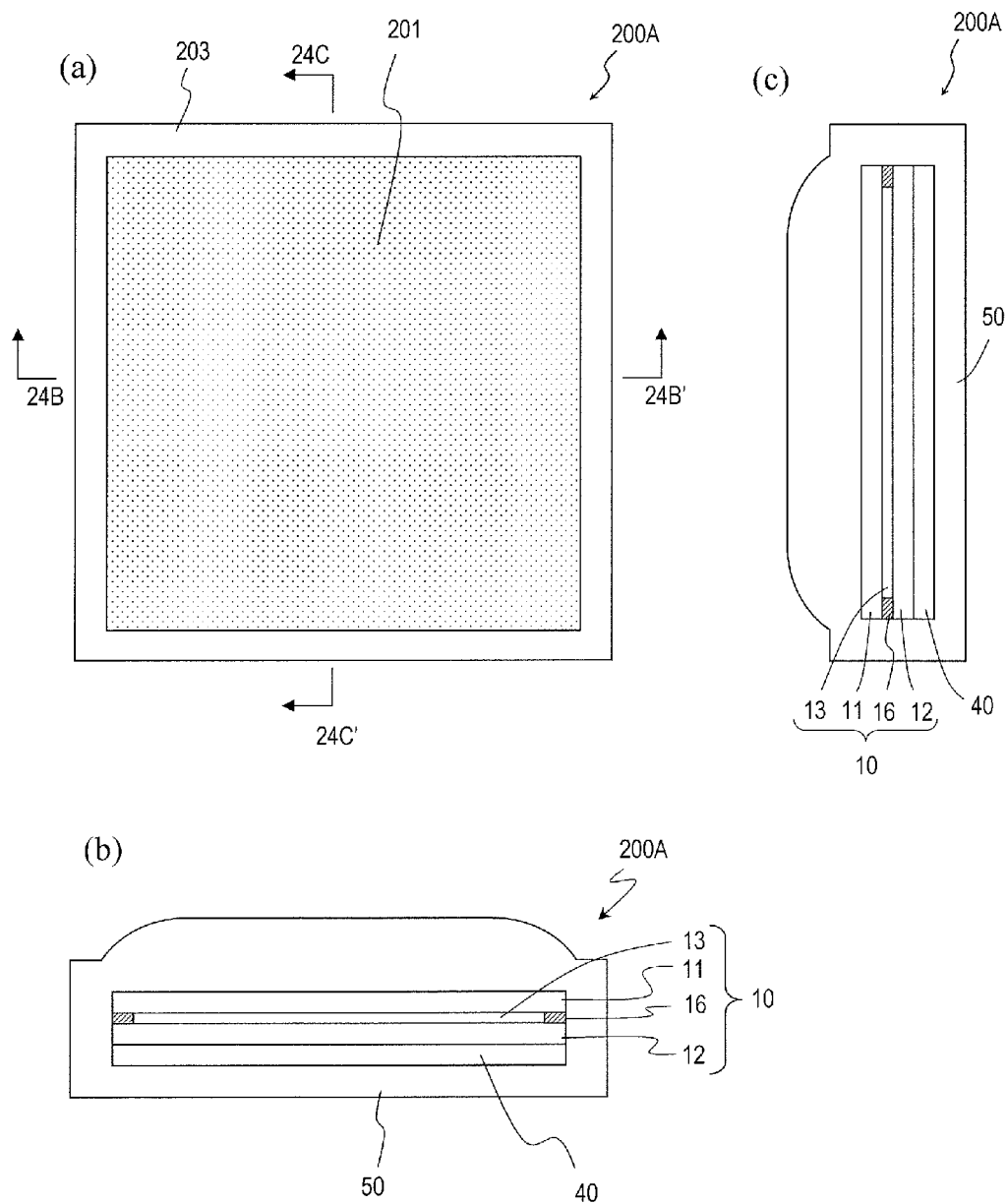
[FIG. 24] (*a*) to (*c*) are schematic diagrams showing a liquid crystal display device 200A of an embodiment of the present invention. (*a*) is a diagram schematically showing the liquid crystal display device 200A, which is seen from the viewer's side. (*b*) is a cross-sectional view taken along line 24B-24B' of (*a*). (*c*) is a cross-sectional view taken along line 24C-24C' of (*a*).
Figure 25:
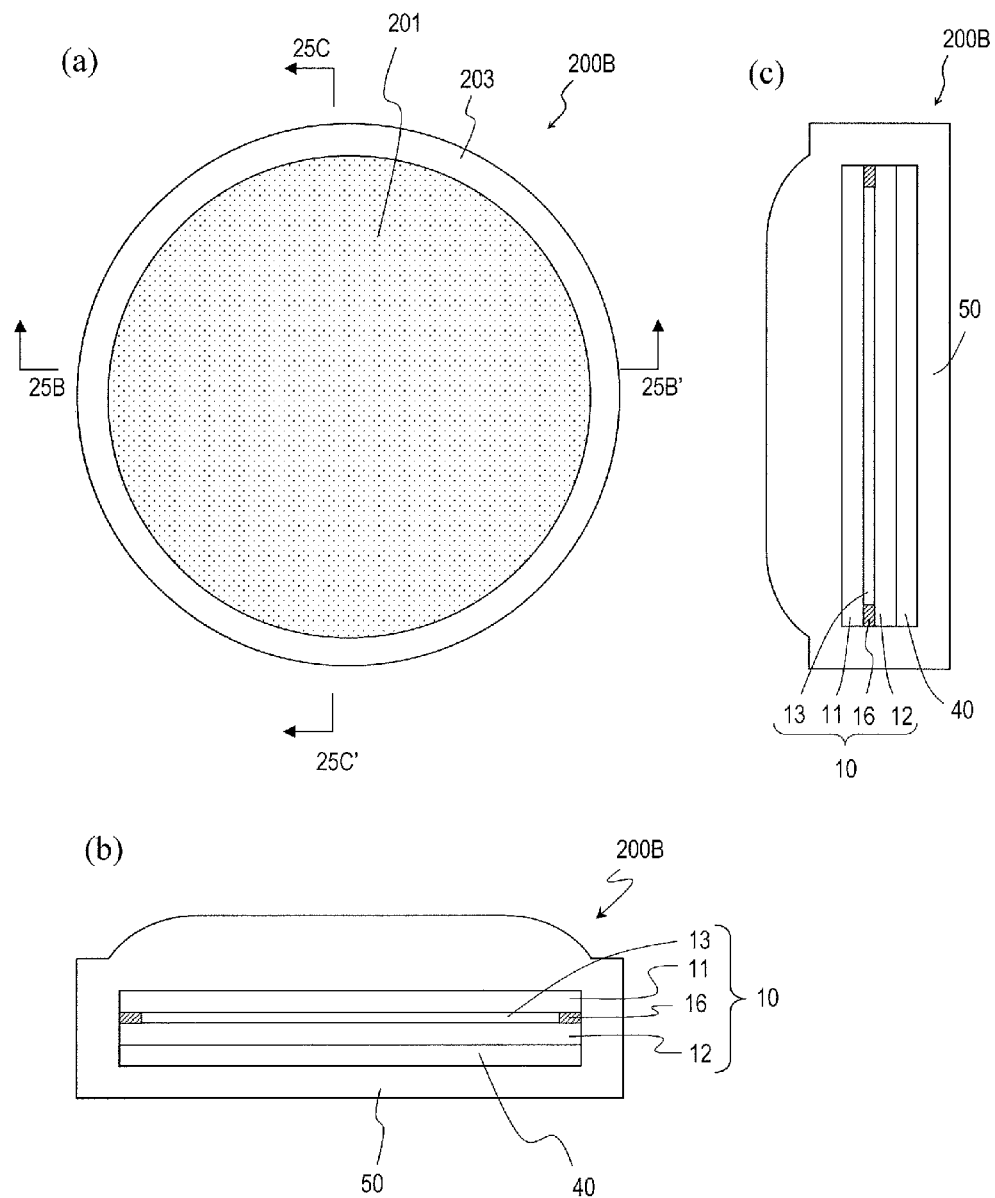
[FIG. 25] (*a*) to (*c*) are schematic diagrams showing a liquid crystal display device 200B of an embodiment of the present invention. (*a*) is a diagram schematically showing a liquid crystal display device 200B, which is seen from the viewer's side. (*b*) is a cross-sectional view taken along line 25B-25B' of (*a*). (*c*) is a cross-sectional view taken along line 25C-25C' of (*a*).

In an example described hereinbelow, frame regions extending along two opposite sides of a rectangular liquid crystal display panel 10 are visually obscured. However, in the case where all the frame regions are visually obscured as in a liquid crystal display device 200A (see FIGS. 24(a) to 24(c)) and a liquid crystal display device 200B (see FIGS. 25(a) to 25(c)) which will be described later, when the display region of the liquid crystal display panel 10 is in a transparent state, the entire liquid crystal display device appears transparent for the viewer. Thus, the liquid crystal display device of an embodiment of the present invention is capable of providing a user with a novel sensation which has never been experienced before.

Hereinafter, why the frame of the liquid crystal display device 100A is visually obscured is described in more detail with reference to FIG. 2 and FIG. 3.

Figure 2:
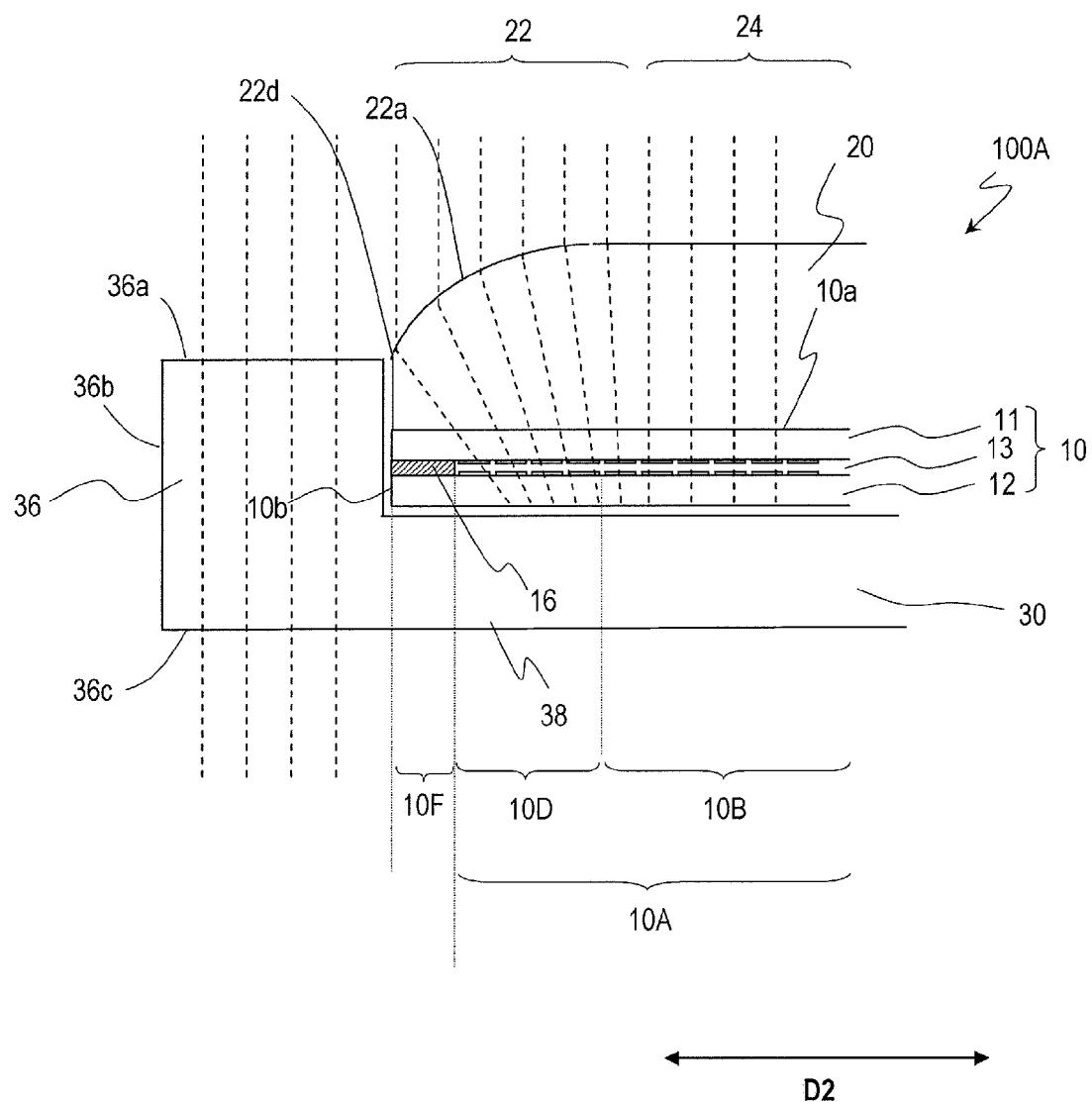
[FIG. 2] An enlarged cross-sectional view schematically showing part of the liquid crystal display device 100A near an edge portion.

FIG. 2 is an enlarged cross-sectional view schematically showing part of the liquid crystal display device 100A near an edge portion.

The liquid crystal display panel 10 has a rectangular shape. In the display region 10A, a plurality of pixels are arrayed in a matrix of rows and columns. The display region 10A includes the peripheral display region 10D that adjoins the frame region 10F and a central display region 10B that forms part of the display region other than the peripheral display region 10D. Here, the row direction is referred to as "first direction D1" (that is identical with the direction vertical to the sheet of FIG. 2, which is shown in FIG. 3 described later), and the column direction is referred to as "second direction D2".

The liquid crystal display panel 10 includes an upper substrate 11 and a lower substrate 12, for example. The liquid crystal display panel 10 further includes a liquid crystal layer 13 between the upper substrate 11 and the lower substrate 12. The lower substrate 12 has, for example, TFTs and pixel electrodes. The upper substrate 11 has, for example, a color filter layer and a counter electrode. The upper side of the upper substrate 11 and the lower side of the lower substrate 12 are provided with polarizers as necessary. The frame region 10F of the liquid crystal display panel 10 includes a sealing portion 16, a driving circuit, etc.

The lens portion 22 of the light-transmitting cover 20 is positioned so as to overlap a region which includes the frame region 10F and the peripheral display region 10D of the liquid crystal display panel 10. The front-side surface 22a of the lens portion 22 (also referred to as "outgoing face") is a curved surface. The flat portion 24 is positioned so as to overlap the central display region 10B. The outgoing face of the flat portion 24 is parallel to a display surface 10a of the liquid crystal display panel 10. The light-transmitting cover 20 has a rectangular shape. The lens portions 22 are provided at two out of the four sides of the light-transmitting cover 20 extending in the first direction D1.

The lateral housing portions 36 of the housing 30 are capable of transmitting light and are provided outside the side surfaces at two out of the four sides of the liquid crystal display panel 10 extending in the first direction D1. The front-side surface 36a and the rear-side surface 36c of the lateral housing portions 36 are parallel to the display surface 10a of the liquid crystal display panel 10.

In FIG. 2, broken lines represent light rays which go out from the pixels arrayed in the display region 10A to enter the light-transmitting cover 20 and light rays which enter the lateral housing portion 36 on its rear side. As shown in FIG. 2, light rays going out from the peripheral display region 10D enter the lens portion 22 and are refracted outwardly (toward the frame region 10F side). Here, the light rays entering the lens portion 22 are refracted at the front-side surface 22a of the lens portion 22 and go out from the front-side surface 22a of the lens portion 22 provided over the peripheral display region 10D and the frame region 10F. The light rays going out from the front-side surface 22a of the lens portion 22 travel straight in a direction perpendicular to the display surface 10a. Therefore, an image formed in the peripheral display region 10D of the liquid crystal display panel 10 is enlarged so as to be displayed in a region constituted of the peripheral display region 10D and the frame region 10F, so that the frame region 10F is visually obscured. Meanwhile, light rays going out from the pixels arrayed in the central display region 10B enter the flat portion 24 and travel straight in a direction perpendicular to the display surface 10a. Therefore, on the front side of the flat portion 24, an image formed in the central display region 10B is displayed. Light rays entering the lateral housing portion 36 at the rear-side surface 36c of the lateral housing portion 36 travel straight through the lateral housing portion 36 in a direction perpendicular to the rear-side surface 36c and go out from the front-side surface 36a. Therefore, the rear environment behind the lateral housing portion 36 is visible to the viewer therethrough. Thus, a display device is realized in which the frame is visually obscured.

The lens portions 22 are provided on frame regions at the two sides extending in the first direction D1, so that part of the image is displayed on the frame regions 10F at the two sides extending in the first direction D1. The lateral housing portions 36 are provided outside the two sides of the liquid crystal display panel 10 extending in the first direction D1, so that the rear environment behind the lateral housing portions 36 outside the two sides of the liquid crystal display panel 10 extending in the first direction D1 is visible to the viewer through the lateral housing portions 36. Therefore, in the liquid crystal display device 100A, the frame portions at the two sides extending in the first direction D1 are visually obscured.

Figure 3:
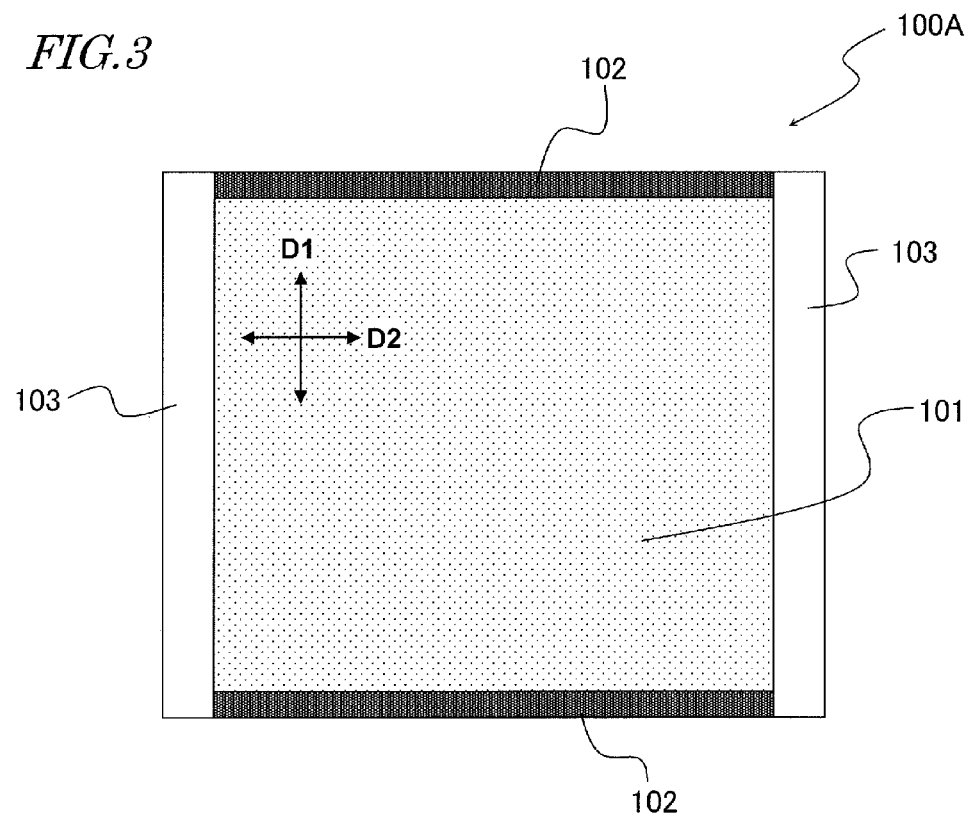
[FIG. 3] A diagram schematically showing the liquid crystal display device 100A, which is seen from the viewer's side.

FIG. 3 schematically shows the liquid crystal display device 100A, which is seen from the viewer's side. FIG. 3 shows a region 101 in which an image is to be displayed, regions 102 in which the frame is visually recognized, and regions 103 in which the rear environment is visible therethrough. As shown in FIG. 3, the frame portions at the two sides extending in the second direction D2 are visually recognized (the regions 102 in which the frame is visually recognized). On the other hand, through the frame portions at the two sides extending in the first direction D1, the rear environment behind the lateral housing portions 36 is visible therethrough (the regions 103 in which the rear environment is visible therethrough). Thus, in the liquid crystal display device 100A, the frame portions at the two sides extending in the first direction D1 can be visually obscured.

In the above-described embodiment, the rear environment is visible through the lateral housing portions on the front side of the lateral housing portions, although the frame can be visually obscured by displaying part of the image formed in the display region on the front side of the lateral housing portions. When part of light going out from the display region is allowed to go out on the front side of the lateral housing portions, part of the image is displayed on the front side of the lateral housing portions. For example, in the above-described embodiment, light going out from the peripheral display region is refracted outwardly so that part of the image is displayed on the frame region of the display panel. However, by refracting the light going out from the peripheral display region more outwardly, part of the image formed in the peripheral display region can be displayed on the front side of the lateral housing portions. Further, by a configuration where a region in which part of the image is displayed and a region in which the rear environment is visible therethrough are present on the front side of the lateral housing portions, the frame can also be visually obscured. By allowing part of light going out from the display region and light entering the lateral housing portions on their rear side to go out on the front side of the lateral housing portions, a region in which the rear environment is visible therethrough and a region in which the image is displayed can be present on the front side of the lateral housing portions. An example of the display device where part of the image is displayed on the front side of the lateral housing portions, and an example of the display device where a region in which part of the image is displayed and a region in which the rear environment is visible therethrough are present on the front side of the lateral housing portions, will be described later in detail.

The bottom housing portion 38 of the housing 30 may be a separate element from the lateral housing portions 36. Even if the bottom housing portion 38 is omitted, the effects of the present invention are not marred. Although the front-side surface 36a and the rear-side surface 36c of the lateral housing portions 36 are flat surfaces which are parallel to the display surface 10a, the shape of the front-side surface and the rear surface of the lateral housing portions are not limited to this shape. Other examples will be described later.

In the above-described liquid crystal display device 100A, the frame portions at two out of the four sides extending in the first direction D1 are visually obscured. Alternatively, other frame portions may be visually obscured. An example of a display device in which other frame portions are visually obscured will be described later.

Now, the shape of the front-side surface 22a of the lens portion 22 is described. The front-side surface 22a of the lens portion 22 is a lens surface which is configured to refract light going out from the pixels arrayed in the peripheral display region 10D toward the viewer's side. For example, a line of intersection between the front-side surface 22a of the lens portion 22 and a plane which is perpendicular to the display surface 10a of the liquid crystal display panel 10 and which is perpendicular to the first direction D1 is a circular arc. Alternatively, the line of intersection between the front-side surface 22a and a plane which is perpendicular to the display surface 10a and which is perpendicular to the first direction D1 may be a curve which is not a circular arc. Particularly, it is preferably a curve which is defined by an aspherical function described in Japanese Patent Application No. 2008-166458. The entire disclosure of Japanese Patent Application No. 2008-166458 is incorporated by reference in this specification.

For example, the shape of the front-side surface 22a of the lens portion 22 can be obtained as described below which is configured such that an image that has been formed in the peripheral display region 10D at an image compression rate a relative to an image formed in the central display region 10B is enlarged by 1/a times so as to be displayed over the front-side surface 22a of the lens portion 22.

The aspherical function f(x) used herein is as follows:

$$f(x) = h - cx^2/(1 + (1 - (1+k)\ c^2 x^2)^{1/2}) A_4 x^4 + A_6 x^6 + A_8 x^8 + A_{10} x^{10}$$

where c: curvature of the lens portion 22 (an inverse of the radius of curvature), h: thickness of the flat portion 24, and k: conic constant.

x represents the position of each point on the front-side surface 22a of the lens portion 22 along the second direction D2. Zero (0) is set on the central display region 10B side. The value increases as the position becomes closer to the frame region 10F.

Assuming that, for example:

width L1 of the peripheral display region 10D: 12 mm;

width L2 of the frame region 10F: 3 mm;

image compression rate a: 0.8 thickness h of the flat portion 24: 13 mm;

radius of curvature (an inverse of the curvature c of the lens portion 22, i.e., 1/c): 23 mm; and refractive index n of the lens portion 22: 1.49 (acrylic resin), the coefficients of the function have the following values.

$k = 1.15$ $A_4 = -7.86 \times 10^{-7}$ $A_6 = 1.89 \times 10^{-8}$ $A_8 = -1.62 \times 10^{-10}$ $A_{10} = 4.95 \times 10^{-13}$ The value of k is expressed by the following formula when a=0.4 to 0.89:

$$k = 89.918 a^4 - 194.57 a^3 + 159.82 a^2 - 57.099 a + 7.1865$$

When the image compression rate is small (e.g., a<0.7), the value of 1/a is large, so that each pixel is greatly enlarged. This can make the black matrix between adjacent pixels conspicuous, resulting in undesirable display in many cases. On the other hand, a large image compression rate (e.g., a>0.9) is not so preferred because a large lens portion is necessary as compared with the width of the frame region. For example, when the image compression rate a is 0.95, a=L1/(L1+L2)=0.95. Thus, the width of the lens portion, L1+L2, is 20 times the width L2 of the frame region. If the width L2 of the frame region is 3 mm as in the above example, the width of the lens portion, L1+L2, is 60 mm. For example, many of the display devices for use in mobile phones have the device width of not more than 60 mm, and therefore, a lens element whose lens portion width L1+L2 is 60 mm cannot be placed. Therefore, the image compression rate a is preferably about 0.7 to 0.9. Based on the above formula, the values of conic constant k for the image compression rate a=0.7, 0.9 are calculated to be k≈0.38, 2.4, respectively. Thus, the preferred range of conic constant k is not less than 0.38 and not more than 2.4.

The above aspherical function f(x) is obtained using the above value of k, and the lens portion 22 which has the front-side surface 22a represented by f(x) is manufactured, whereby an undistorted image can be displayed in the peripheral display region 10D and the frame region 10F.

The surface shape of the lens portion 22 is not limited to the above-described curved surface but may be, for example, a Fresnel lens shape.

As described above, in a display device which includes a sole display panel, the frame region and part of the housing which is provided outside the frame region (lateral housing portions) are observed. However, when part of light going out from a peripheral display region is allowed to go out on the front side of the lateral housing portions, part of the image is displayed on the front side of the lateral housing portions. When light entering the lateral housing portions on their rear side is allowed to go out on the front side of the lateral housing portions, the rear environment behind the lateral housing portions is visible to the viewer therethrough. As a result, the frame can be visually obscured.

A display device of the present embodiment in which the light-transmitting cover and the housing are separate components, such as the liquid crystal display device of the present embodiment, is suitably applicable to products, such as TV sets, monitors, digital photo frames, mobile phones, personal data assistants (PDA), navigation devices (PND), etc.

Next, a liquid crystal display device which is another embodiment of the present invention (the liquid crystal display device 100B shown in FIG. 4) is described with reference to FIG. 4 to FIG. 6.

Figure 4:
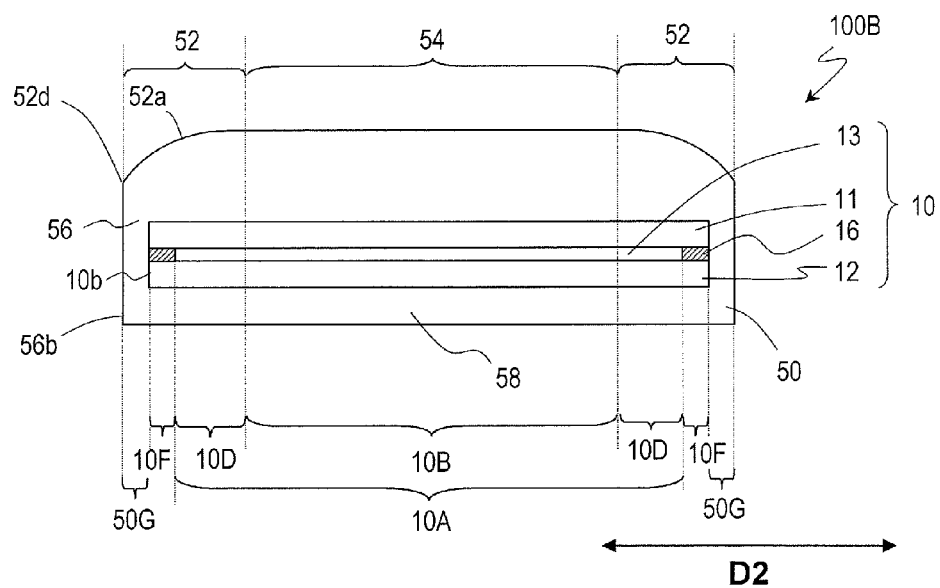
[FIG. 4] A schematic cross-sectional view of a liquid crystal display device 100B of an embodiment of the present invention.

The liquid crystal display device 100B shown in FIG. 4 is configured such that part of an image formed in the display region is displayed on the front side of the lateral housing portions, whereby the frame is visually obscured, whereas the liquid crystal display device 100A (see FIG. 1) is configured such that the rear environment behind the lateral housing portions is visible to the viewer, whereby the frame is visually obscured. The liquid crystal display device 100B is also different from the liquid crystal display device 100A in that the lens portions are positioned so as to overlap regions which are constituted of the peripheral display regions 10D, the frame regions 10F and panel vicinity portions 50G (described later). The liquid crystal display device 100B shown in FIG. 4 includes a lens-integrated housing 50 (described later) instead of the light-transmitting cover and the housing. The liquid crystal display panel 10 of the liquid crystal display device 100B shown in FIG. 4 is the same as the liquid crystal display panel 10 of the liquid crystal display device 100A. For the sake of simplicity, in FIG. 4 to FIG. 6, the same components as those of the liquid crystal display device 100A shown in FIG. 1 to FIG. 3 are designated by the same reference numerals, and the descriptions thereof are herein omitted.

FIG. 4 is a schematic cross-sectional view of the liquid crystal display device 100B. The liquid crystal display device 100B includes the sole liquid crystal display panel 10 and the lens-integrated housing 50.

As shown in FIG. 4, the lens-integrated housing 50 is a single element into which the housing and the light-transmitting cover are integrated. The lens-integrated housing 50 includes lateral housing portions 56, a bottom housing portion 58, lens portions 52, and a flat portion 54. The lateral housing portions 56 are provided on side surfaces 10b of the liquid crystal display panel 10. The bottom housing portion 58 is provided under the liquid crystal display panel 10. The lens portions 52 are positioned so as to overlap regions which include the frame regions 10F and the peripheral display regions 10D of the liquid crystal display panel 10 and the panel vicinity portions 50G. The panel vicinity portions 50G refer to parts of the lateral housing portions 56 in which the lens portions 52 are provided at the front side. As shown in FIG. 4, the lens portions 52 are positioned such that outer edges 52d of the lens portions 52 are present on the front side of the outer end surfaces (or "side surfaces") 56b of the lateral housing portions 56. Therefore, in the liquid crystal display device 100B, the lens portions 52 extend over the entire front side of the lateral housing portions 56, and therefore, the panel vicinity portions 50G correspond to regions in which the lateral housing portions 56 are provided.

Light going out from the peripheral display regions 10D is refracted by means of the lens portions 52 such that images formed in the peripheral display regions 10D are enlarged so as to be displayed over regions constituted of the peripheral display regions 10D, the frame regions 10F, and the panel vicinity portions 50G. As described above, the lens portions 52 are provided over the entire front side of the lateral housing portions 56, and therefore, part of the images are displayed on the front side of the lateral housing portions 56 by the lens portions 52. Thus, since parts of the images are displayed on the front side of the frame regions 10F and the lateral housing portions 56, a display device in which the frame is visually obscured is realized.

Hereinafter, why the frame of the liquid crystal display device 100B is visually obscured is described in more detail with reference to FIG. 5 and FIG. 6. FIG. 5 is an enlarged cross-sectional view schematically showing part of the liquid crystal display device 100B near an edge portion. FIG. 6 is a diagram schematically showing the liquid crystal display device 100B, which is seen from the viewer's side.

Figure 5:
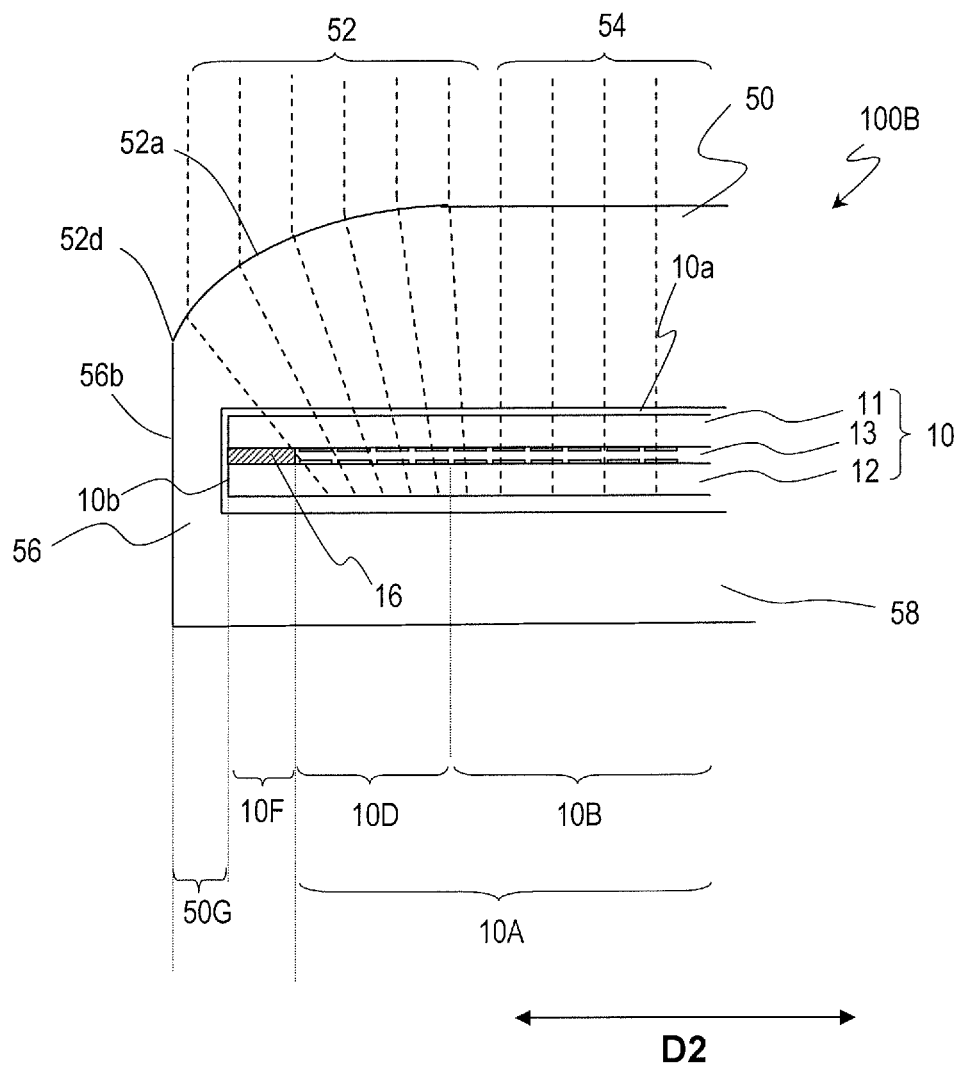
[FIG. 5] An enlarged cross-sectional view schematically showing part of the liquid crystal display device 100B near an edge portion.

As shown in FIG. 5, the lens portion 52 of the lens-integrated housing 50 is provided in a region which includes the peripheral display region 10D and the frame region 10F of the liquid crystal display panel 10 and the panel vicinity portion 50G, and the front-side surface 52a of the lens portion 52 is a curved surface. The flat portion 54 is positioned so as to overlap the central display region 10B of the liquid crystal display panel 10. The front-side surface of the flat portion 54 is parallel to the display surface 10a. The lateral housing portions 56 are provided outside the side surfaces 10b at two out of the four sides of the rectangular liquid crystal display panel 10 extending in the first direction D1. The lens portions 52 are positioned so as to overlap regions at the two sides extending in the first direction D1, each of the regions including the peripheral display region 10D, the frame region 10F and the panel vicinity portion 50G.

In FIG. 5, broken lines represent light rays which go out from the pixels arrayed in the display region 10A to enter the lens portions 52 and the flat portion 54. Light rays coming in at the rear side of the display device and transmitted through the peripheral display region 10D enter the lens portion 52 and are refracted outwardly (toward the frame region 10F side). Here, the light rays entering the lens portion 52 are refracted at the front-side surface 52a of the lens portion 52 and go out from the front-side surface 52a of the lens portion 52 provided over the peripheral display region 10D, the frame region 10F, and the panel vicinity portion 50G. The light rays going out from the front-side surface 52a of the lens portion 52 travel straight in a direction perpendicular to the display surface 10a. Therefore, an image formed in the peripheral display region 10D of the liquid crystal display panel 10 is enlarged so as to be displayed in a region constituted of the peripheral display region 10D, the frame region 10F, and the panel vicinity portion 50G. Meanwhile, light rays going out from the pixels arrayed in the central display region 10B enter the flat portion 54 and travel straight in a direction perpendicular to the display surface 10a (FIG. 5). Therefore, on the front side of the flat portion 54, an image formed in the central display region 10B is displayed.

Since, as shown in FIG. 5, in the liquid crystal display device 100B, the panel vicinity portion 50G corresponds to a region in which the lateral housing portion are provided, the situation that part of an image is displayed on the panel vicinity portion 50G means that the lateral housing portion 56 is visually obscured. Therefore, the frame of the liquid crystal display device 100B (the frame region 10F and the lateral housing portions 56) is visually obscured.

Since the lens portions 52 are provided over the peripheral display regions 10D, the frame regions 10F, and the panel vicinity portions 50G at the two sides extending in the first direction D1, part of the image is displayed over the frame regions 10F and the panel vicinity portions 50G at the two sides extending in the first direction D1. Therefore, the frame portions of the liquid crystal display device 100B at the two sides extending in the first direction D1 are visually obscured.

Figure 6:
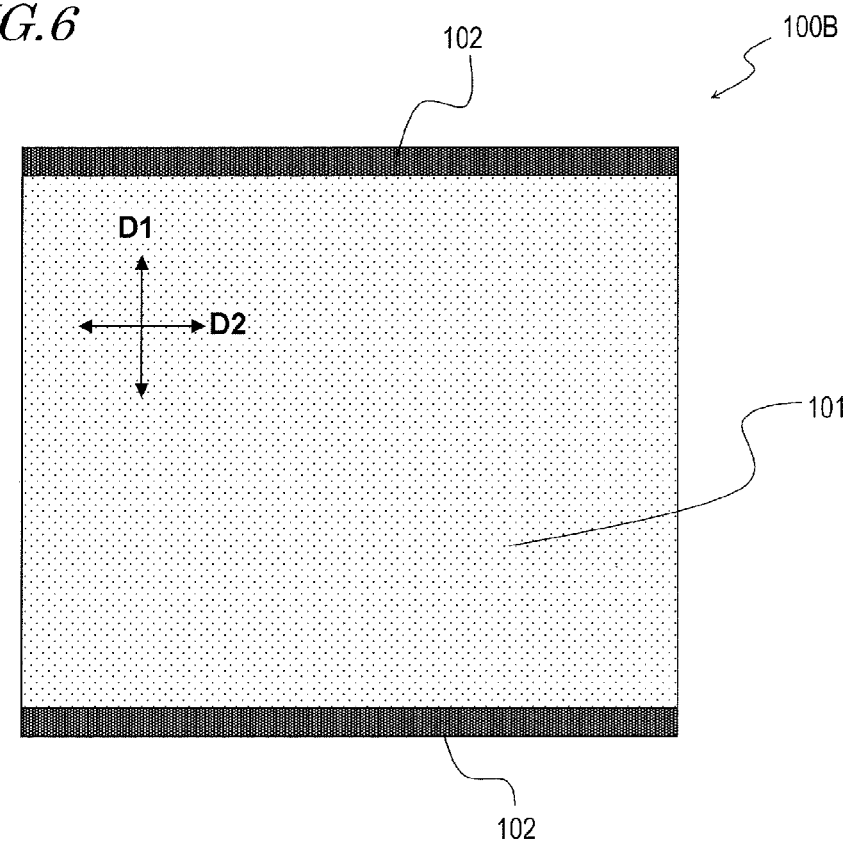
[FIG. 6] A diagram schematically showing the liquid crystal display device 100B, which is seen from the viewer's side.

As shown in FIG. 6, when the liquid crystal display device 100B is viewed from the viewer's side, the frame portions at the two sides extending in the second direction D2 are visually recognized (the regions 102 in which the frame is visually recognized). On the other hand, the frame portions at the two sides extending in the first direction D1 are included in a region 101 in which an image is to be displayed. Thus, in the liquid crystal display device 100B, the frame portions at the two sides extending in the first direction D1 are visually obscured.

Since the liquid crystal display device 100B (see FIG. 4 to FIG. 6) includes the lens-integrated housing 50 instead of the light-transmitting cover and the housing, entry of dust and dirt is advantageously prevented. Note that the liquid crystal display device 100B may include the light-transmitting cover and the housing instead of the lens-integrated housing 50. Even in such a case, the frame is visually obscured so long as the lens portion of the light-transmitting cover has the above-described configuration.

Next, an liquid crystal display device which is still another embodiment of the present invention is described with reference to FIG. 7 to FIG. 9.

Figure 7:
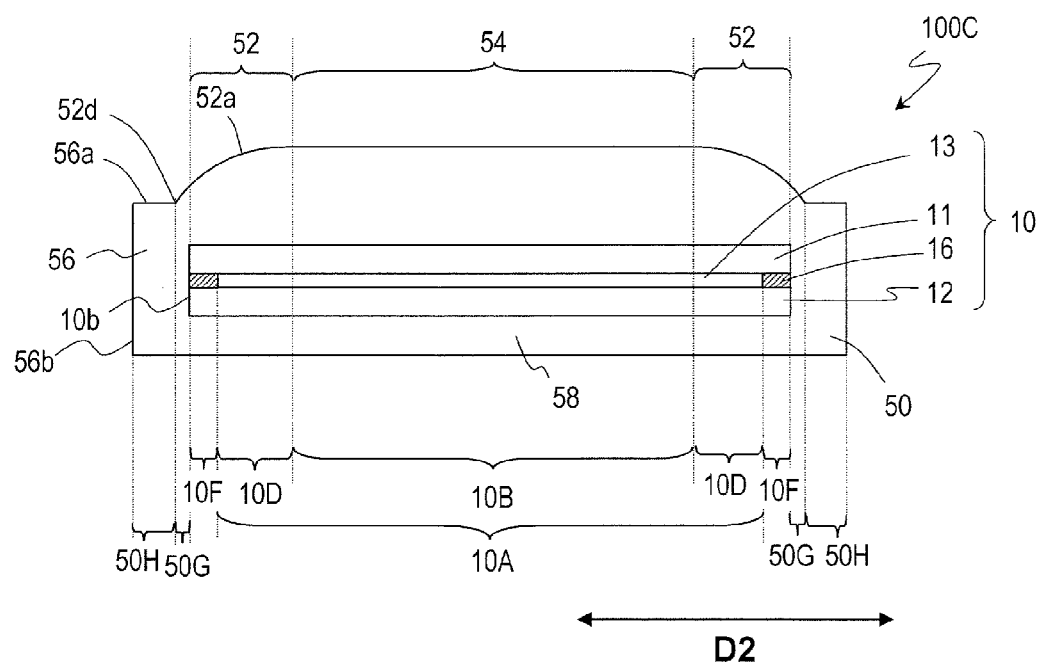
[FIG. 7] A schematic cross-sectional view of a liquid crystal display device 100C of an embodiment of the present invention.

In the liquid crystal display device 100C shown in FIG. 7, a region in which part of an image is displayed and a region in which the rear environment is visible therethrough are present on the front side of the lateral housing portions, whereby the frame is visually obscured. Hereinafter, for the sake of simplicity, the same components as those shown in FIG. 1 to FIG. 6 are designated by the same reference numerals, and the descriptions thereof are herein omitted.

FIG. 7 is a schematic cross-sectional view of the liquid crystal display device 100C. The liquid crystal display device 100C includes the sole liquid crystal display panel 10 and the lens-integrated housing 50.

The lens-integrated housing 50 is capable of transmitting light and includes the lateral housing portions 56, the bottom housing portion 58, the lens portions 52, and the flat portion 54. The lateral housing portions 56 are provided on the side surfaces 10b of the liquid crystal display panel 10. The lens portions 52 are positioned so as to overlap regions which include the frame regions 10F and the peripheral display regions 10D of the liquid crystal display panel 10 and the panel vicinity portions 50G. Light going out from the peripheral display regions 10D are outwardly refracted by the lens portions 52. Therefore, images formed in the peripheral display regions 10D are enlarged so as to be displayed over regions constituted of the peripheral display regions 10D, the frame regions 10F, and the panel vicinity portions 50G.

As shown in FIG. 7, the side surfaces 56b of the lateral housing portions 56 are at outer positions relative to outer edges 52d of the lens portions 52. Therefore, on the front side of the lateral housing portions 56, regions in which the lens portions 52 are not provided are present in parts of the lateral housing portions 56 which are exclusive of the panel vicinity portions 50G (parts of the lateral housing portions 56 in which the lens portions 52 are provided on the front side). Hereinafter, the parts of the lateral housing portions 56 in which the lens portions 52 are not provided on the front side are referred to as "outer portions 50H". The outer portions 50H are capable of transmitting light, so that part of light entering the outer portions 50H on their rear side go out on the front side of the outer portions 50H. Therefore, on the outer portions 50H, the rear environment behind the outer portions 50H is visible to the viewer therethrough.

Since there are regions in which part of an image is displayed (the panel vicinity portions 50G) and regions in which the rear environment is visible therethrough on the front side of the lateral housing portions 56 (the outer portions 50H), the lateral housing portions 56 are visually obscured. Therefore, a display device is realized in which the frame (the frame regions 10F and the lateral housing portions 56 of the liquid crystal display panel 10) is visually obscured.

Hereinafter, why the frame of the liquid crystal display device 100C is visually obscured is described in more detail with reference to FIG. 8 and FIG. 9. FIG. 8 is an enlarged cross-sectional view schematically showing part of the liquid crystal display device 100C near an edge portion. FIG. 9 is a diagram schematically showing the liquid crystal display device 100C, which is seen from the viewer's side.

Figure 8:
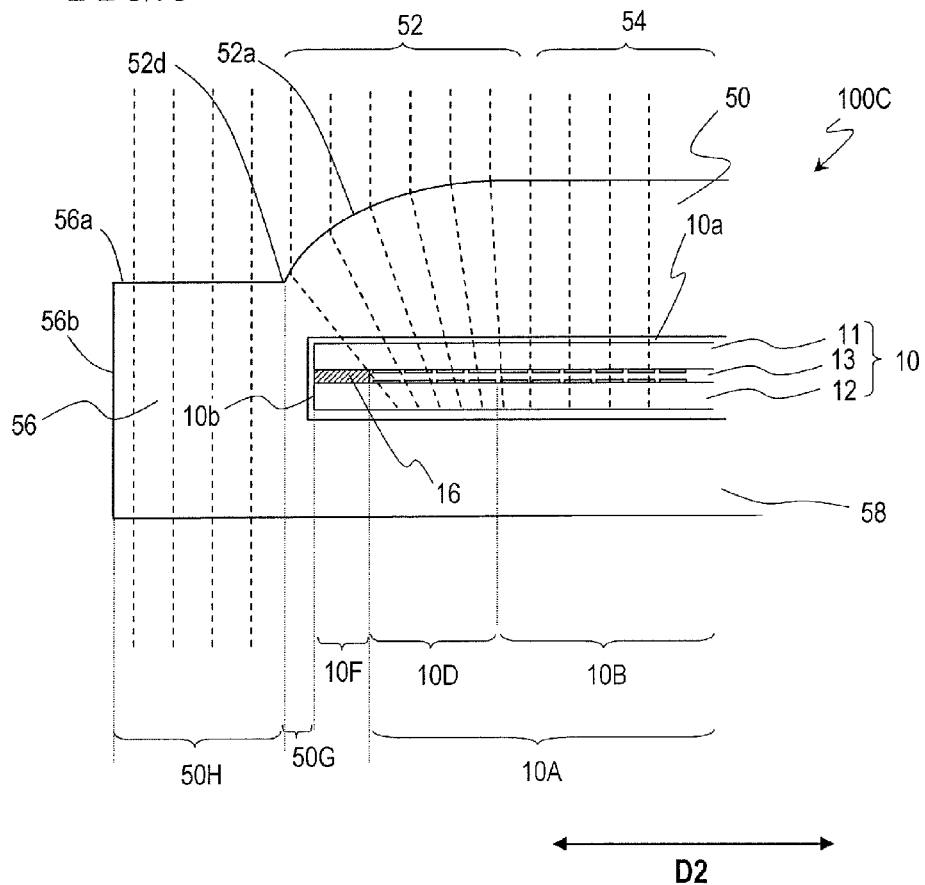
[FIG. 8] An enlarged cross-sectional view schematically showing part of the liquid crystal display device 100C near an edge portion.

As shown in FIG. 8, light coming in at the rear side of the display device and transmitted through the peripheral display region 10D is outwardly refracted at the front-side surface 52a of the lens portion 52 and goes out from the front-side surface 52a of the lens portion 52 which is provided over the peripheral display region 10D, the frame region 10F, and the panel vicinity portion 50G. Therefore, an image formed in the peripheral display region 10D is enlarged so as to be displayed over a region constituted of the peripheral display region 10D, the frame region 10F, and the panel vicinity portion 50G. The front-side surface 56a and the rear-side surface 56c of the lateral housing portions 56 are parallel to the display surface 10a. Light entering the outer portion 50H of the lateral housing portion 56 on its rear side travels straight through the outer portion 50H in a direction perpendicular to the display surface 10a and goes out toward the front side. Thus, on the outer portion 50H, the rear environment behind the outer portion 50H is visible therethrough.

In the lateral housing portion 56, part of an image is displayed on the panel vicinity portion 50G, while in the outer portion 50H, the rear environment is visible therethrough. Therefore, the lateral housing portion 56 is visually obscured. Therefore, the frame of the liquid crystal display device 100C (the frame region 10F and the lateral housing portions 56) is visually obscured. The lens portions 52 and the lateral housing portions 56 are provided at the two sides of the liquid crystal display device 100C extending in the first direction D1. In the liquid crystal display device 100C, the frame portions at the two sides extending in the first direction D1 are visually obscured.

Figure 9:
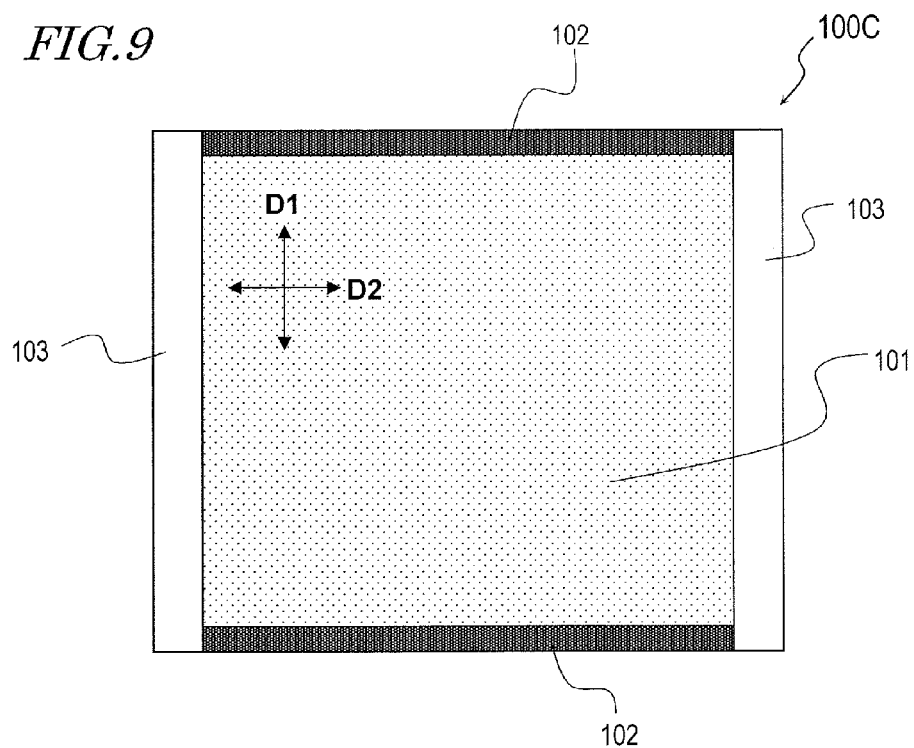
[FIG. 9] A diagram schematically showing the liquid crystal display device 100C, which is seen from the viewer's side.

As shown in FIG. 9, when the liquid crystal display device 100C is viewed from the viewer's side, the frame portions at the two sides extending in the second direction D2 are visually recognized (the regions 102 in which the frame is visually recognized). On the other hand, on the frame portions at the two sides extending in the first direction D1, the rear environment is visible therethrough (the regions 103 in which the rear environment is visible therethrough). Thus, in the liquid crystal display device 100C, the frame portions at the two sides extending in the first direction D1 are visually obscured.

In the liquid crystal display device 100C, regions in which the rear environment is visible therethrough are present on the front side of the lateral housing portions 56 as described above. Therefore, the region in which an image is to be displayed (i.e., the panel vicinity portions 50G) can be decreased as compared to a display device which is configured to display an image over the entire lateral housing portions (the liquid crystal display device 100B). Therefore, the liquid crystal display device 100C can have smaller lens portions than the liquid crystal display device 100B does. Because in the liquid crystal display device 100C the lens portion is provided in part of the lateral housing portion in which an image is to be displayed, whereas in the liquid crystal display device 100B the lens portion is provided over the entire lateral housing portion.

To improve the shock resistance of the liquid crystal display device 100C, the width of the lateral housing portions 56 (the width of the second direction D2 in FIG. 7 and FIG. 8) may be increased. In the liquid crystal display device 100C, when the width of the lateral housing portions 56 is increased, it is not necessary to change the size of the panel vicinity portions. Therefore, the shock resistance can be improved without changing the size of the lens portions. On the other hand, in the liquid crystal display device 100B, when the width of the lateral housing portions is increased, the panel vicinity portions are also increased. The increased panel vicinity portions lead to increased lens portions, and accordingly, the weight and manufacture cost disadvantageously increase. The liquid crystal display device 100C has an advantage over the liquid crystal display device 100B, such that a thin, light-weight display device which has high shock resistance can be realized at low cost.

Since the liquid crystal display device 100C includes portions on which an image is to be displayed in part of the lateral housing portions (panel vicinity portions), the liquid crystal display device 100C is advantageous in that, when the display device is viewed in an oblique viewing direction, the side surfaces of the display panel are visually obscured. Note that the visual obscurity of the side surfaces of the display panel increases as the panel vicinity portions become larger.

As for the lateral housing portions 56 of the lens-integrated housing 50 of the liquid crystal display device 100C, the front-side surface 56a and the rear-side surface 56c are parallel to the display surface 10a, although the shape of the lateral housing portions 56 is not limited to this example. For example, at least one of the front-side surface 56a and the rear-side surface 56c of the lateral housing portions 56 may be a lens surface. A display device example where at least one of the front-side surface 56a and the rear-side surface 56c of the lateral housing portions 56 is a lens surface is described with reference to FIG. 10 to FIG. 13. FIG. 10 to FIG. 13 are enlarged schematic cross-sectional views of the display device where at least one of the front-side surface 56a and the rear-side surface 56c of the lateral housing portions 56 is a lens surface, showing part of the device near an edge portion.

Figure 10:
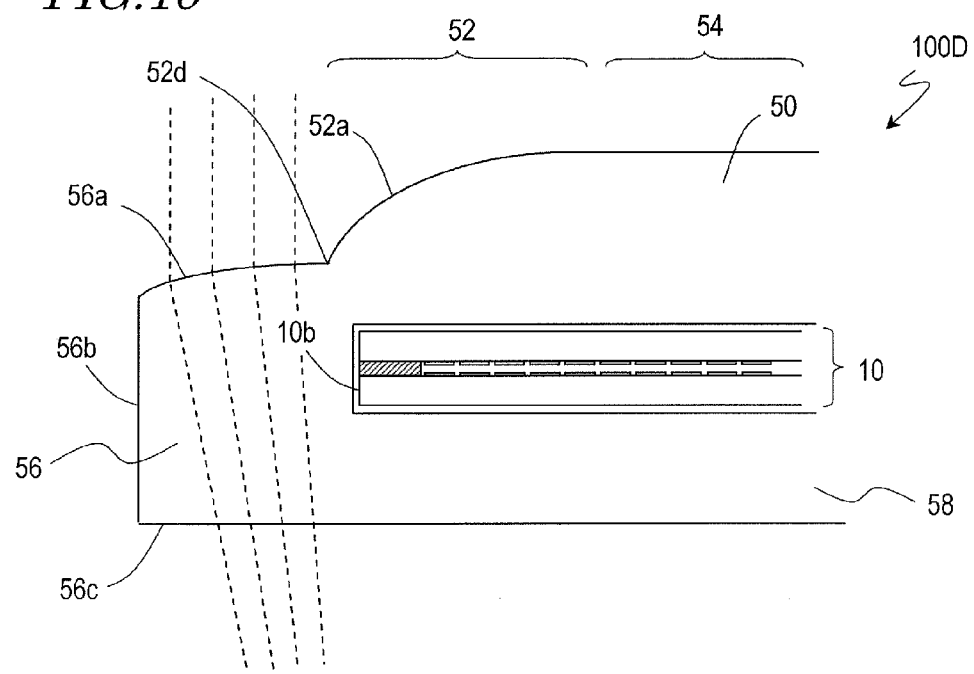
[FIG. 10] An enlarged cross-sectional view schematically showing part of the liquid crystal display device 100D of an embodiment of the present invention near an edge portion.

FIG. 10 is a schematic enlarged cross-sectional view of an edge portion of a liquid crystal display device 100D where the front-side surface 56a of the lateral housing portion 56 is a curved surface. The front-side surface 56a of the lateral housing portion 56 of the liquid crystal display device 100D is a curved surface which is configured such that the distance between the curved surface and the rear-side surface 56c decreases along the direction from the center to the perimeter of the display device (from right to left in the sheet of FIG. 10). As illustrated in FIG. 10, light rays entering the rear-side surface 56c are outwardly refracted and go out from the front-side surface 56a. The light rays going out from the front-side surface 56a to the viewer (light rays traveling in a direction normal to the display surface 10a) are, as illustrated in FIG. 10, derived from light rays which have entered the lateral housing portion 56 at positions that are closer to the display panel than the positions on the front-side surface 56a from which the light rays go out. Therefore, part of the rear environment behind the display panel, rather than behind the lateral housing portion 56, is visible through the lateral housing portion 56 to the viewer.

Figure 11:
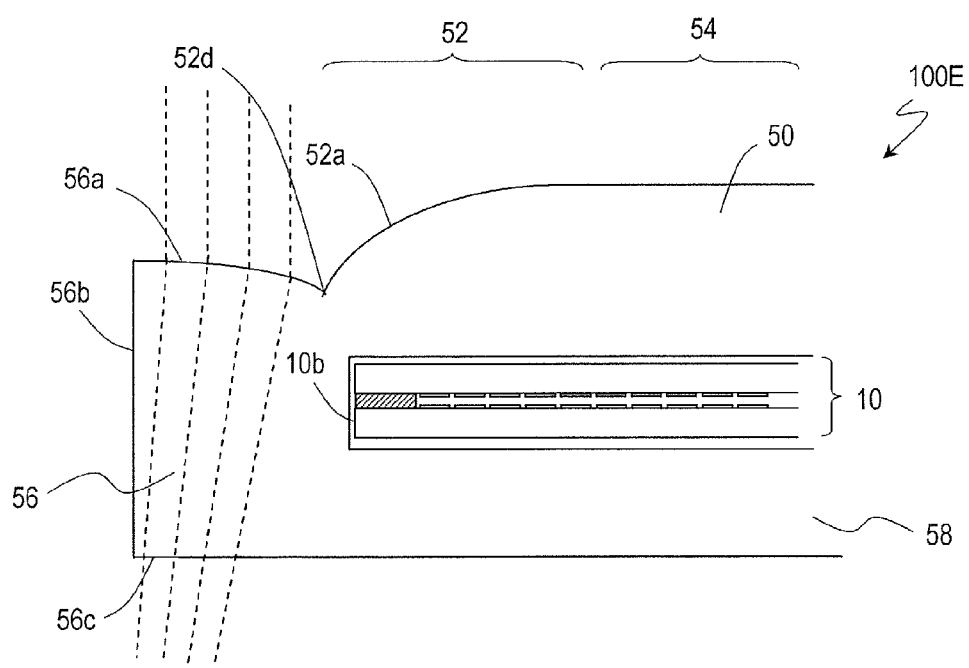
[FIG. 11] An enlarged cross-sectional view schematically showing part of the liquid crystal display device 100E of an embodiment of the present invention near an edge portion.

Alternatively, as in a liquid crystal display device 100E shown in FIG. 11, the front-side surface 56a of the lateral housing portion 56 may be a curved surface which is configured such that the distance between the curved surface and the rear-side surface 56c increases along the direction from the center to the perimeter of the display device (from right to left in the sheet of FIG. 11). As illustrated in FIG. 11, light rays entering the rear-side surface 56c are inwardly refracted and go out from the front-side surface 56a. The light rays going out from the front-side surface 56a to the viewer are, as illustrated in FIG. 11, derived from light rays which have entered the lateral housing portion 56 at outer positions relative to the positions on the front-side surface 56a from which the light rays go out. Therefore, the rear environment behind an outer position relative to the lateral housing portion 56 is visible through the lateral housing portion 56 to the viewer. In the liquid crystal display device 100E, the side surface 10b of the liquid crystal display panel 10 is visually obscured as compared to the liquid crystal display device 100D (FIG. 10).

Figure 12:
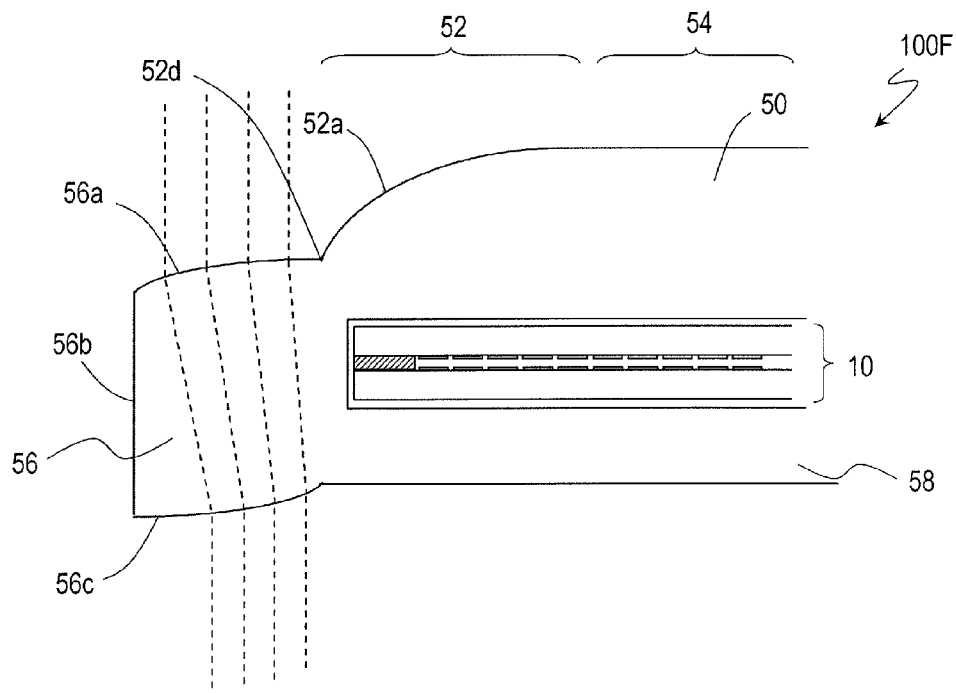
[FIG. 12] An enlarged cross-sectional view schematically showing part of the liquid crystal display device 100F of an embodiment of the present invention near an edge portion.

A liquid crystal display device 100F shown in FIG. 12 is different from the liquid crystal display device 100D (see FIG. 10) in that the rear-side surface 56c of the lateral housing portion 56 is a curved surface. As shown in FIG. 12, light rays entering the lateral housing portion 56 are refracted twice, at the rear-side surface 56c and the front-side surface 56a. The light rays entering the lateral housing portion 56 are outwardly refracted at the rear-side surface 56c and then inwardly refracted at the front-side surface 56a. Since the refraction by the front-side surface 56a and the refraction by the rear-side surface 56c occur in opposite directions, as illustrated in FIG. 12, light rays impinging on the rear-side surface 56c from a direction normal to the display surface of the display panel are refracted twice and go out from the front-side surface 56a to the viewer. Therefore, the rear environment behind the lateral housing portion 56 is visible to the viewer therethrough, so that the viewer is prevented from having a sense of discontinuity between part of the rear environment which can be seen outside the lateral housing portion 56 and another part of the rear environment which is visible through the lateral housing portion 56. As described above, in the case of the liquid crystal display device 100D, part of the rear environment behind the display panel, rather than behind the lateral housing portion 56, may sometimes be visible through the lateral housing portion 56. Thus, the liquid crystal display device 100D may sometimes provide a sense of discontinuity between part of the rear environment which can be seen outside the liquid crystal display device 100D and another part of the rear environment which is visible through the lateral housing portion 56. Thus, the liquid crystal display device 100F has an advantage over the liquid crystal display device 100D such that a sense of discontinuity with respect to the rear environment is prevented.

Figure 13:
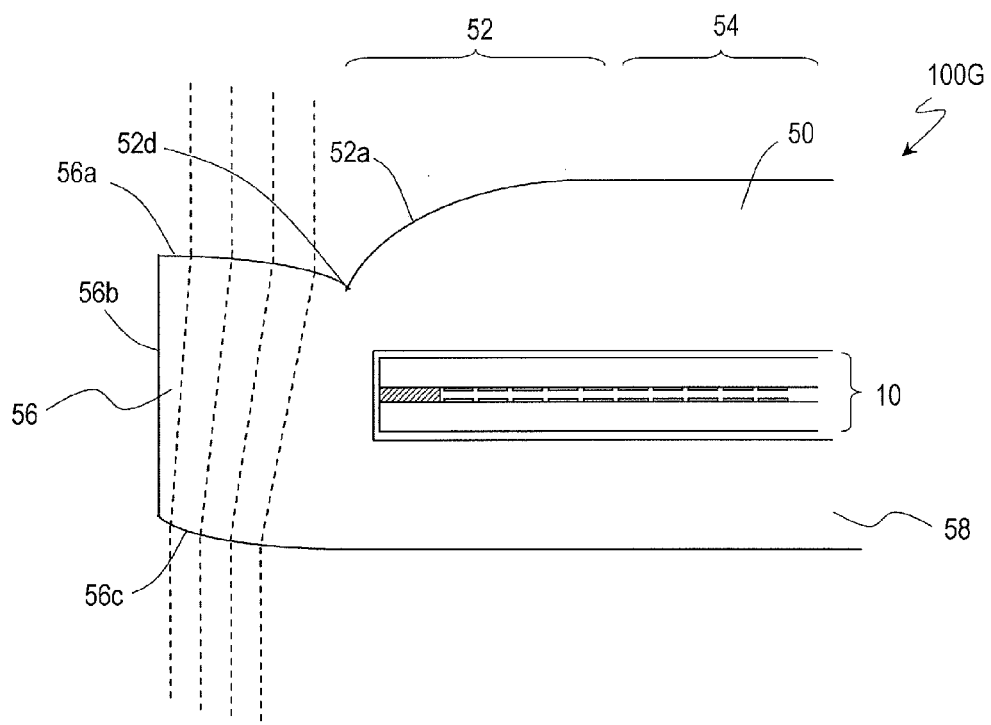
[FIG. 13] An enlarged cross-sectional view schematically showing part of the liquid crystal display device 100G of an embodiment of the present invention near an edge portion.

A liquid crystal display device 100G shown in FIG. 13 is different from the liquid crystal display device 100E (FIG. 11) in that the rear-side surface 56c of the lateral housing portions 56 is a curved surface. As in the liquid crystal display device 100F (FIG. 12), light rays entering the lateral housing portion 56 are refracted twice, at the rear-side surface 56c and the front-side surface 56a. The liquid crystal display device 100G also advantageously prevents provision of a sense of discontinuity between part of the rear environment which can be seen outside the liquid crystal display device 100G and another part of the rear environment which is visible through the lateral housing portion 56.

Next, a liquid crystal display device which is still another embodiment of the present invention is described with reference to FIG. 14 to FIG. 16.

Figure 14:
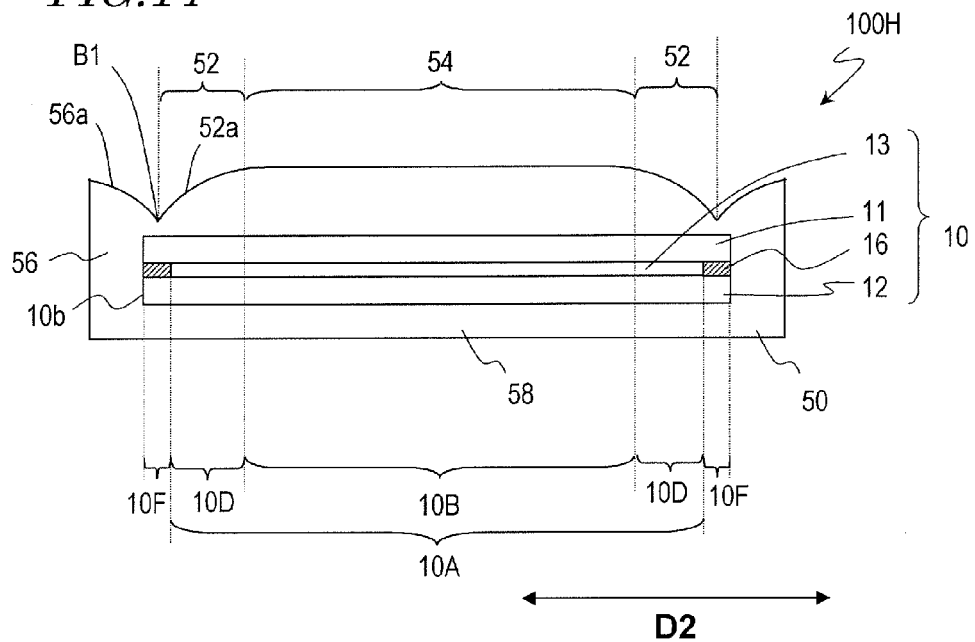
[FIG. 14] A schematic cross-sectional view of a liquid crystal display device 100H of an embodiment of the present invention.

The liquid crystal display device 100H shown in FIG. 14 is configured such that the front-side surface 56a of the lateral housing portion 56 and the front-side surface 52a of the lens portion 52 form a boundary B1. An image is displayed inside the boundary B1, while the rear environment is visible therethrough outside the boundary B1, so that the frame is visually obscured.

FIG. 14 is a schematic cross-sectional view of the liquid crystal display device 100H. The liquid crystal display device 100H includes the sole liquid crystal display panel 10 and the lens-integrated housing 50.

The lateral housing portions 56 of the lens-integrated housing 50 are configured such that the front-side surface 56a of the lateral housing portions 56 and the front-side surface 52a of the lens portions 52 form a boundary B1. The lateral housing portions 56 are provided on the side surfaces 10b of the liquid crystal display panel 10 and in part of the frame regions 10F. As shown in FIG. 14, the boundary B1 is on the front side of the frame regions 10F. Therefore, the lateral housing portions 56 are in parts of the frame regions 10F which are present at outer positions relative to the boundaries B1.

The lateral housing portions 56 are capable of transmitting light. The front-side surfaces 56a of the lateral housing portions 56 are lens surfaces. Light rays entering the lateral housing portions 56 on the rear side of the lateral housing portions 56 are inwardly refracted and go out toward the front side. Therefore, the rear environment behind the lateral housing portion 56 is visible to the viewer therethrough at an outer position relative to the boundary B1.

The lens portion 52 is provided inside the boundary B1 between the peripheral display region 10D and the frame region 10F. Light rays going out from the peripheral display region 10D are outwardly refracted by the lens portion 52, so that an image formed in the peripheral display region 10D is enlarged so as to be displayed over a region constituted of the peripheral display region 10D and part of the frame region 10F lying inside the boundary B1.

In the case of the liquid crystal display device 100H, in a region outside the boundary B1 (i.e., a region where the lateral housing portion 56 is provided), the rear environment is visible therethrough, while in a region inside the boundary B1, an image is displayed. Therefore, a display device in which the frame is visually obscured can be realized.

Hereinafter, why the frame of the liquid crystal display device 100H is visually obscured is described in more detail with reference to FIG. 15 and FIG. 16. FIG. 15 is an enlarged cross-sectional view schematically showing part of the liquid crystal display device 100H near an edge portion. FIG. 16 is a diagram schematically showing the liquid crystal display device 100H, which is seen from the viewer's side.

Figure 15:
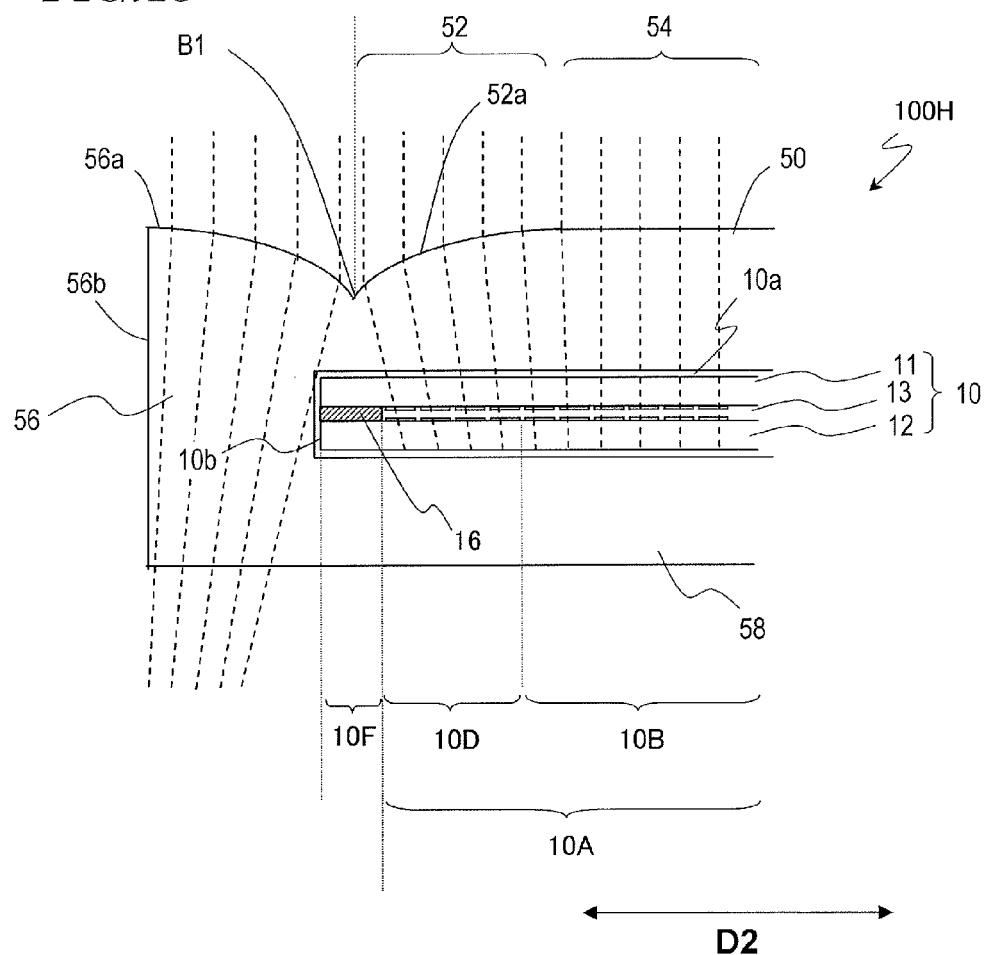
[FIG. 15] An enlarged cross-sectional view schematically showing part of the liquid crystal display device 100H near an edge portion.

As shown in FIG. 15, light coming in at the rear side of the display device and transmitted through the peripheral display region 10D is outwardly refracted at the front-side surface 52a of the lens portion 52 and goes out from the front-side surface 52a of the lens portion 52. Therefore, an image formed in the peripheral display region 10D is enlarged so as to be displayed over a region constituted of the peripheral display region 10D and part of the frame region 10F (part of the frame region 10F lying inside the boundary B1). The rear-side surface of the lateral housing portion 56 is parallel to the display surface 10a. The front-side surface 56a of the lateral housing portion 56 is a lens surface which is configured such that the distance between the front-side surface 56a and the rear-side surface 56c increases along the direction from the boundary B1 to the perimeter. Therefore, light rays entering the lateral housing portion 56 at the rear-side surface 56c are inwardly refracted at the front-side surface 56a and go out from the front side of the lateral housing portion 56 (i.e., part of the lateral housing portion 56 lying outside the boundary B1). Light rays going out from the front-side surface 56a of the lateral housing portion 56 travel straight in a direction perpendicular to the display surface 10a. Therefore, the rear environment behind the lateral housing portion 56 is visible therethrough over a portion lying outside the boundary B1.

In part of the frame region 10F lying inside the boundary B1, part of an image is displayed, while in the part of the frame region 10F lying outside the boundary B1, the rear environment is visible therethrough, so that the frame region 10F is visually obscured. In part of the lateral housing portion 56 lying outside the side surface 10b of the liquid crystal display panel 10, the rear environment is visible therethrough. Therefore, in the liquid crystal display device 100H, the frame (the frame region 10F and the lateral housing portion 56) is visually obscured. The lens portions 52 and the lateral housing portions 56 are provided at the two sides of the liquid crystal display device 100H extending in the first direction D1. In the liquid crystal display device 100H, the frame at the two sides extending in the first direction D1 is visually obscured.

Figure 16:
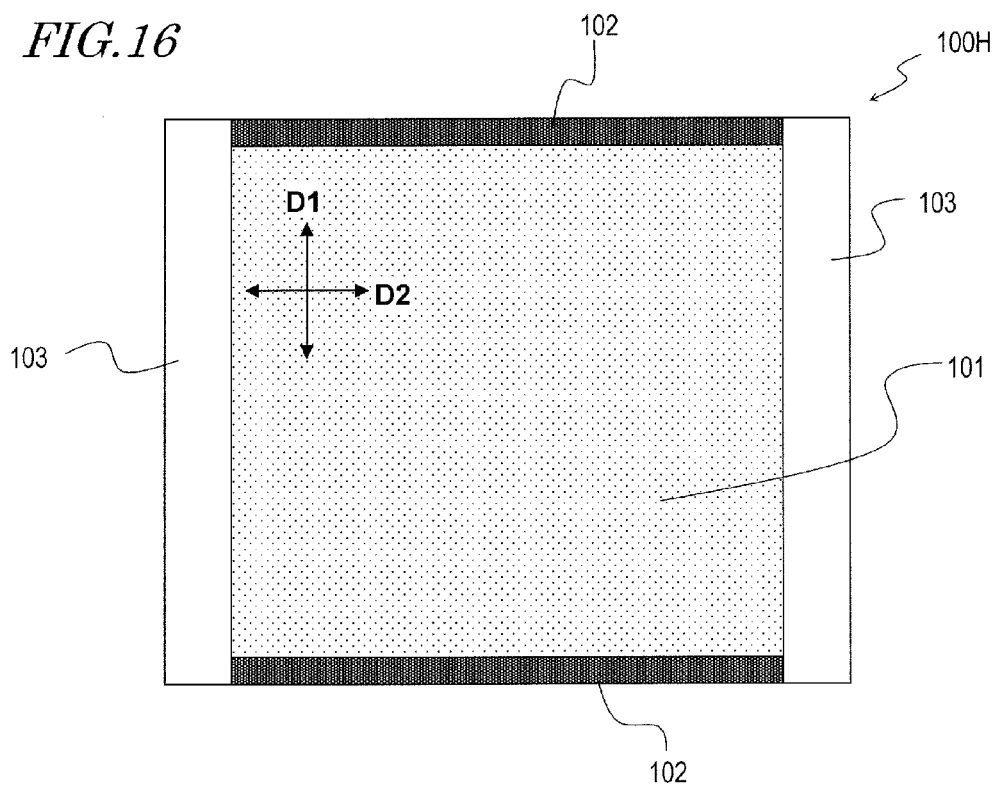
[FIG. 16] A diagram schematically showing the liquid crystal display device 100H, which is seen from the viewer's side.

As shown in FIG. 16, when the liquid crystal display device 100H is viewed from the viewer's side, the frame portions at the two sides extending in the second direction D2 are visually recognized (the regions 102 in which the frame is visually recognized). On the other hand, on the frame portions at the two sides extending in the first direction D1, the rear environment is visible therethrough (the regions 103 in which the rear environment is visible therethrough). Thus, in the liquid crystal display device 100H, the frame portions at the two sides extending in the first direction D1 are visually obscured.

In the liquid crystal display device 100H, the frame region 10F includes a region where the rear environment is visible therethrough. Therefore, as compared to a display device which displays an image over the entirety of the frame region 10F, the region in which the image is to be displayed can be decreased. Thus, the lens portions 52 can be decreased, and the thickness and the weight of the display device can be reduced.

Next, the shape of the front-side surface 52a of the lens portion 52 is described. Hereinafter, the lens portion 52 of the lens-integrated housing 50 of the above-described embodiment is described as an example.

The front-side surface 52a of the lens portions 52 is a lens surface which is configured to refract light going out from the pixels arrayed in the peripheral display region 10D toward the viewer's side. For example, the front-side surface 52a of the lens portion 52 may be a curved surface which is configured such that a line of intersection between the front-side surface 52a and a plane which is perpendicular to the display surface 10a of the liquid crystal display panel 10 and which is perpendicular to the first direction D1 is a circular arc. Alternatively, the line of intersection between the front-side surface 52a and a flat surface which is perpendicular to the display surface 10a and which is perpendicular to the first direction D1 may be a curve which is not a circular arc. Particularly, it is preferably a curve defined by an aspherical function described in Japanese Patent Application No. 2008-166458 which has been mentioned above.

For example, by designing the lens portion 52 in the same way as described above, an image that has been formed in the peripheral display region 10D at the image compression rate a relative to an image formed in the central display region 10B is enlarged by 1/a times so as to be displayed over the front-side surface 52a of the lens portion 52. Accordingly, an undistorted image can be displayed in a region constituted of the peripheral display region 10D, the frame region 10F, and the panel vicinity portion 50G.

Figure 17:
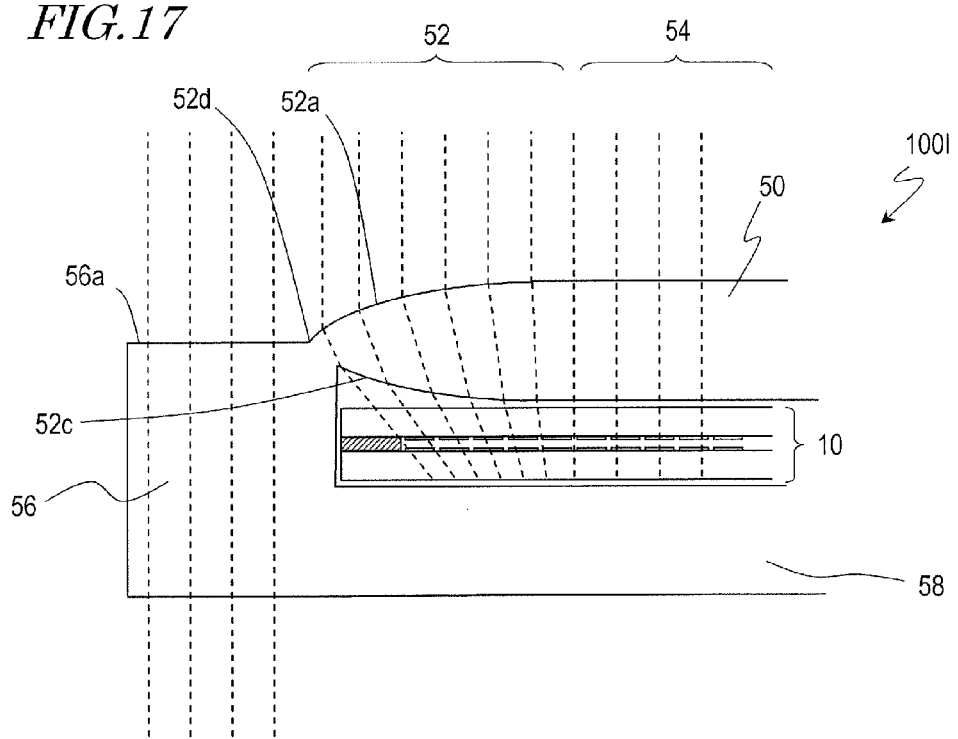
[FIG. 17] An enlarged cross-sectional view schematically showing part of the liquid crystal display device 100I of an embodiment of the present invention near an edge portion.
Figure 18:
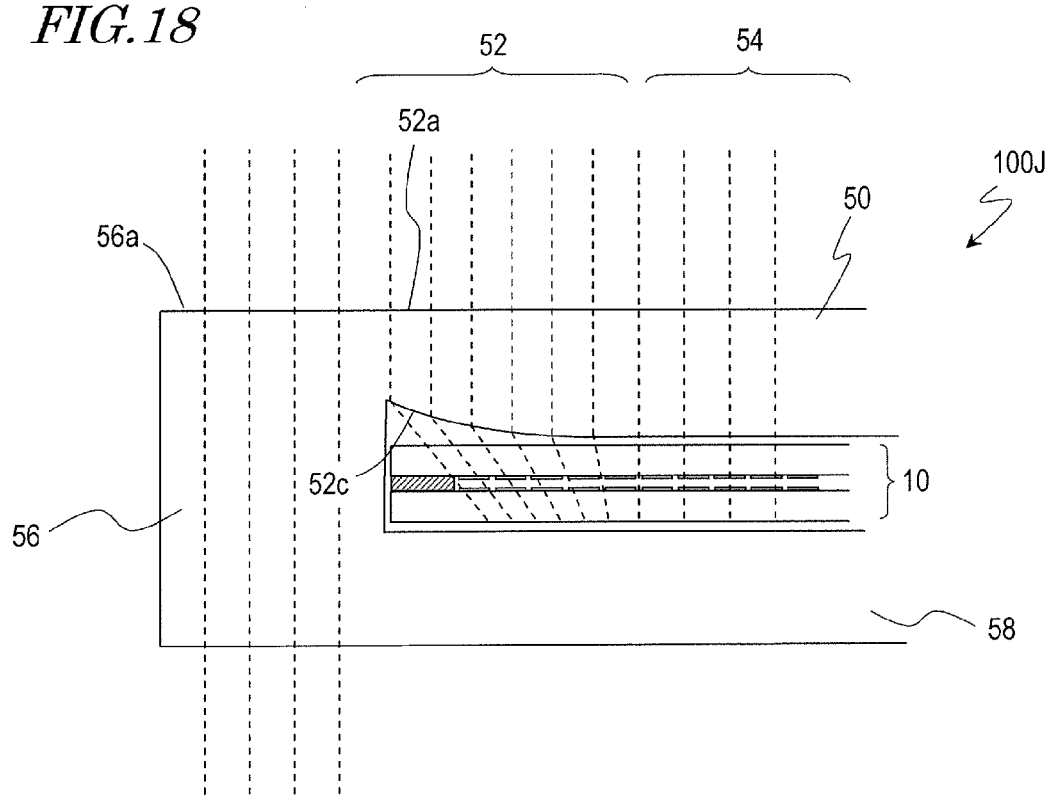
[FIG. 18] An enlarged cross-sectional view schematically showing part of the liquid crystal display device 100J of an embodiment of the present invention near an edge portion.

In the lens portion 52 of the above-described embodiments, only the front-side surface 52a is a curved surface, although the lens portion 52 may be configured such that both the front-side surface 52a and the rear-side surface 52c may be curved surfaces. FIG. 17 shows a liquid crystal display device 100I in which the front-side surface 52a and the rear-side surface 52c of the lens portion are curved surfaces. The liquid crystal display device 100I shown in FIG. 17 is different from the liquid crystal display device 100C (see FIG. 8) in that both surfaces of the lens portion 52 are curved surfaces. In the liquid crystal display device 100I, both the front-side surface 52a and the rear-side surface 52c of the lens portion 52 are curved surfaces. As shown in FIG. 17, light rays entering the lens portion 52 are refracted twice before going out of the lens portion 52. Therefore, the liquid crystal display device 100I has an advantage that the thickness and the weight can be reduced as compared to a display device in which only one of the surfaces is a curved surface. When both surfaces of the lens portion 52 are curved surfaces, both a line of intersection between the front-side surface 52a and a plane which is perpendicular to the display surface 10a and a line of intersection between the rear-side surface 52c and a plane which is perpendicular to the display surface 10a may be circular arcs. Alternatively, at least one of these intersection lines may be a curve which is defined by an aspherical function. Alternatively, at least one of the front-side surface 52a and the rear-side surface 52c may be another free curved surface (see Japanese Patent Application No. 2008-167828). The entire disclosure of Japanese Patent Application No. 2008-167828 is incorporated by reference in this specification. As in a liquid crystal display device 100J shown in FIG. 18, only the rear-side surface 52c of the lens portion 52 may be a curved surface, while the front-side surface 52a may be a flat surface. The liquid crystal display device 100J has an advantage that dust and dirt on the front-side surface 52a can be wiped away more easily.

Figure 19:
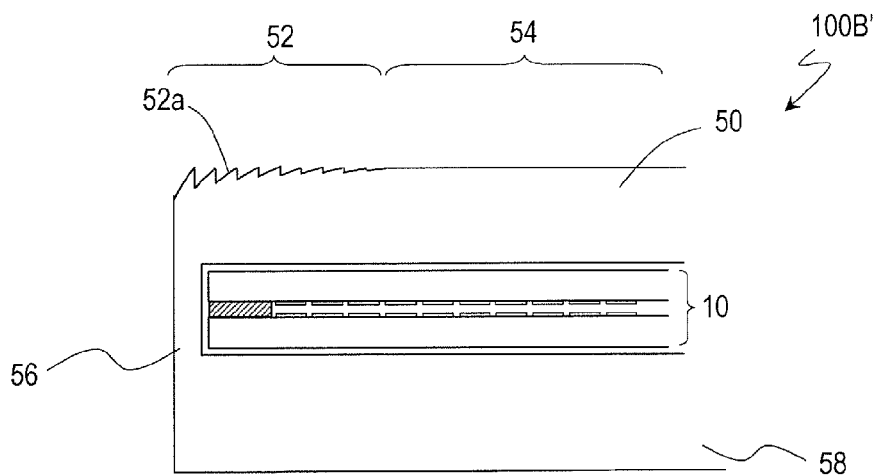
[FIG. 19] An enlarged cross-sectional view schematically showing part of the liquid crystal display device 100B' of an embodiment of the present invention near an edge portion.
Figure 20:
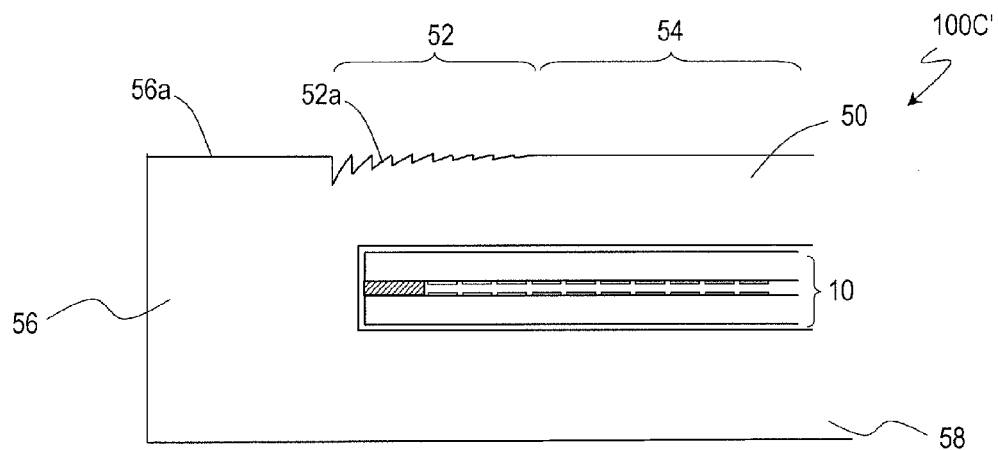
[FIG. 20] An enlarged cross-sectional view schematically showing part of the liquid crystal display device 100C' of an embodiment of the present invention near an edge portion.
Figure 21:
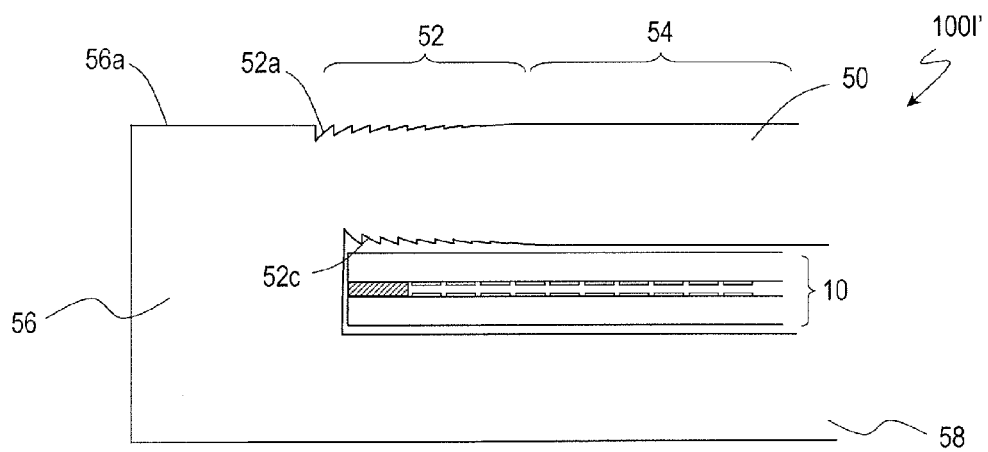
[FIG. 21] An enlarged cross-sectional view schematically showing part of the liquid crystal display device 100I' of an embodiment of the present invention near an edge portion.

Although the curved lens surface examples have been described, the lens surfaces may not be curved surfaces. For example, at least one of the front-side surface 52a and the rear-side surface 52c of the lens portion 52 may be a Fresnel lens. FIG. 19 to FIG. 21 are schematic enlarged cross-sectional views of an edge portion of a display device which has a Fresnel lens surface.

A liquid crystal display device 100B' shown in FIG. 19 is different from the liquid crystal display device 100B (see FIG. 5) in that the front-side surface 52a of the lens portion 52 is a Fresnel lens surface. A liquid crystal display device 100C' shown in FIG. 20 is different from the liquid crystal display device 100C (see FIG. 8) in that the front-side surface 52a of the lens portion 52 is a Fresnel lens surface. A liquid crystal display device 100I' shown in FIG. 21 is different from the liquid crystal display device 100I (see FIG. 17) in that the front-side surface 52a and the rear-side surface 52c of the lens portion 52 are Fresnel lens surfaces.

In the liquid crystal display devices 100B' (FIG. 19), 100C' (FIG. 20), and 100I' (FIG. 21), the lens portion has a Fresnel lens surface. Therefore, the thickness and the weight of these display devices are advantageously smaller than those of the liquid crystal display devices 100B (FIG. 4), 100C (FIG. 8), and 100I (FIG. 17), respectively. Further, since the front-side surface 52a of the lens portion 52 is a Fresnel lens surface, the lens portion 52 seemingly has a nearly flat surface, which is preferred in terms of design as compared with a case where it is a curved surface (see Japanese Patent Application No. 2007-303624). The entire disclosure of Japanese Patent Application No. 2007-303624 is incorporated by reference in this specification.

If the interval between adjacent grooves of the Fresnel lens surface is different from the interval between adjacent pixels of the display region 10A, occurrence of moiré fringes can preferably be prevented. For example, when the interval between adjacent pixels is 100 μm, it is preferred that the interval between grooves of the Fresnel lens surface is not more than 20 μm or not less than 200 μm.

Figure 22:
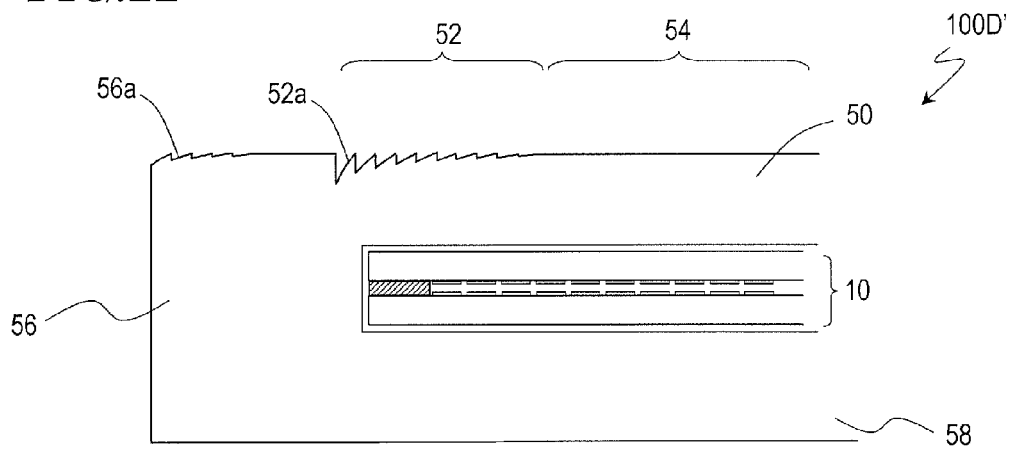
[FIG. 22] An enlarged cross-sectional view schematically showing part of the liquid crystal display device 100D' of an embodiment of the present invention near an edge portion.
Figure 23:
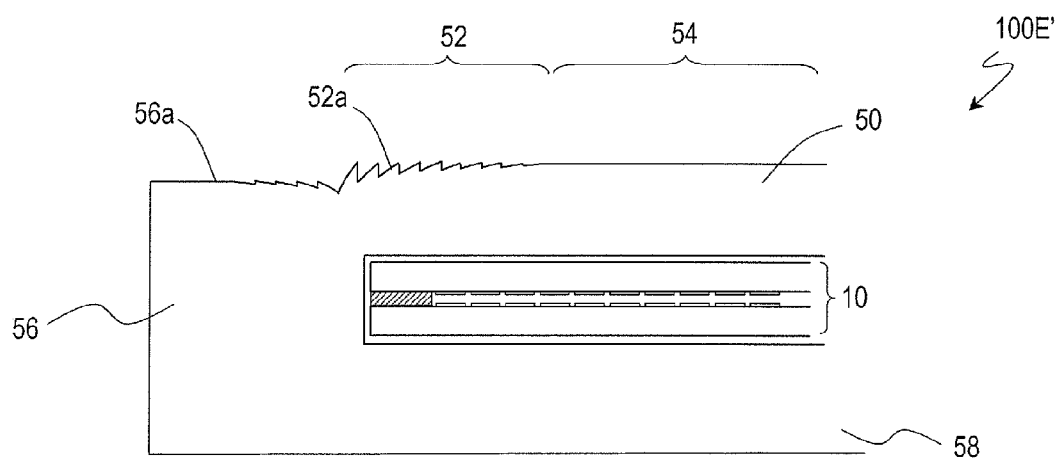
[FIG. 23] An enlarged cross-sectional view schematically showing part of the liquid crystal display device 100E' of an embodiment of the present invention near an edge portion.

Even when at least one of the front-side surface 56a and the rear-side surface 56c of the lateral housing portion 56 is a lens surface, the at least one surface may be a Fresnel lens surface (FIGS. 22 and 23). A liquid crystal display device 100D' shown in FIG. 22 is different from the liquid crystal display device 100D (FIG. 10) in that the front-side surface 56a of the lateral housing portion 56 and the front-side surface 52a of the lens portion 52 are Fresnel lens surfaces. A liquid crystal display device 100E' shown in FIG. 23 is different from the liquid crystal display device 100E (FIG. 11) in that the front-side surface 56a of the lateral housing portion 56 and the front-side surface 52a of the lens portion 52 are Fresnel lens surfaces. The thickness and the weight of the liquid crystal display device 100D' and the liquid crystal display device 100E' are smaller than those of the liquid crystal display device 100D and the liquid crystal display device 100E, respectively.

The lens-integrated housing 50 which as a Fresnel lens surface may be formed by, for example, injection molding with the use of a mold having a surface in which a Fresnel lens surface is formed by a cutting technique.

The liquid crystal display devices 100B to 100J of the above embodiments have the lens-integrated housing 50 into which the lateral housing portion 56, the bottom housing portion 58, the lens portion 52, and the flat portion 54 are integrated. However, these components may be provided as separate elements and combined together for use. For example, the liquid crystal display panel 10 may be sandwiched by a plurality of elements and secured with screws, nail structures, adhesive tapes, or the like.

The light-transmitting cover 20 and the housing 30 of the liquid crystal display device 100A and the lens-integrated housing 50 of the liquid crystal display devices 100B to 100J of the above-described embodiments can be manufactured using, for example, an acrylic or polycarbonate material, by injection molding or the like.

In the previously-described examples of the above embodiments, the front-side surface 56a and the rear-side surface 56c of the lateral housing portion 56 are a flat surface or lens surface, although the corner of the lateral housing portion 56 at the intersection of the side surface 56b and the front-side surface 56a may have a curved surface for the sake of design or for the convenience of handling.

The above-described examples of the liquid crystal display devices of the embodiments have a rectangular display panel, in which the frame portions at two out of the four sides of the display device are visually obscured. For example, alternatively, the frame portion at only one side may be visually obscured. Still alternatively, the frame portions at three or four sides may be visually obscured.

FIGS. 24(a) to 24(c) shows a liquid crystal display device 200A in which the four sides of the frame are visually obscured. FIG. 24(a) is a schematic diagram of the liquid crystal display device 200A which is seen from the viewer's side. FIGS. 24(b) and 24(c) are schematic cross-sectional views taken along line 24B-24B' and line 24C-24C' of FIG. 24(a). The liquid crystal display device 200A has lateral housing portions 56 and lens portions 52 at four sides. As shown in FIGS. 24(b) and 24(c), the cross-sectional structure of the liquid crystal display device 200A is similar to that of the liquid crystal display device 100C (see FIG. 7). Therefore, the rear environment is visible through the outer portions of the lateral housing portions 56. FIG. 24(a) shows a region 201 in which an image is to be displayed and a region 203 through which the rear environment is visible. As shown in FIG. 24(a), the rear environment is visible through the frame portions at the four sides of the liquid crystal display device 200A. Thus, a display device in which the frame portions at the four sides are visually obscured is realized.

When the frame portions at the four sides are visually obscured as in the liquid crystal display device 200A shown in FIG. 24(a), the corner between two adjacent sides may be visually obscured. The shape of the lens portion provided at the corner is preferably, for example, part of a body of revolution (see Japanese Patent Application No. 2008-322964). The entire disclosure of Japanese Patent Application No. 2008-322964 is incorporated by reference in this specification.

The present invention is applicable to, for example, a display device which includes a circular shape display panel or an oval shape display panel as the display panel. As the circular shape display panel, for example, a known circular shape display panel described in Patent Document 3 may be used.

FIGS. 25(a) to 25(c) show schematic diagrams of a liquid crystal display device 200B which includes a circular shape liquid crystal display panel 10. FIG. 25(a) is a schematic diagram of the liquid crystal display device 200B which is seen from the viewer's side. FIGS. 25(b) and 25(c) are schematic cross-sectional views respectively taken along line 25B-25B' and line 25C-25C' of FIG. 25(a). In liquid crystal display device 200B, the lateral housing portion and the lens portion are provided along the circumference.

As shown in FIGS. 25(b) and 25(c), the cross-sectional structure of the liquid crystal display device 200B is similar to that of the liquid crystal display device 100C (see FIG. 7). Therefore, the configuration which visually obscures the frame along the circumference of the liquid crystal display device 200B is similar to that of the liquid crystal display device 100C (see FIG. 7). That is, the rear environment is visible through the outer portion of the lateral housing portion, whereby the frame is visually obscured. FIG. 25(a) shows a region 201 in which an image is to be displayed and a region 203 through which the rear environment is visible. As shown in FIG. 25(a), the rear environment is visible through the frame portion along the circumference of the liquid crystal display device 200B. Thus, a circular display device in which the frame portion along the circumference is visually obscured is realized.

In the liquid crystal display device 200A (FIG. 24) and the liquid crystal display device 200B (FIG. 25) which have been described above, an image of the rear environment which is obtained by CCD or the like is displayed in the display region, whereby the display device can be made as if the display device did not exist there. The technique of obscuring an object such that a viewer cannot visually recognize the object is sometimes called "active camouflage". Also, by altering the display region into a transparent state, the display device is visually obscured as if it did not exist.

The front-side surface of the lens-integrated housing 50 are preferably provided with an antireflection treatment. For example, the surface reflection can be reduced by forming a thin film layer which has a different refractive index from that of the lens-integrated housing 50 through, for example, a deposition or coating step. Alternatively, an antireflection film (or "AR film") which is formed by multiple dielectric films or an antireflection film which has a motheye structure may be attached. Note that, when the surface is a Fresnel lens surface, an antireflection treatment can be provided through, for example, a coating step by means of deposition, dip coating, etc.

Since the image formed in the peripheral display region 10D is enlarged by the lens portion so as to be displayed over a region constituted of the frame region 10F and the peripheral display region 10D, it is preferred that the image formed in the peripheral display region 10D is compressed relative to the image formed in the central display region 10B. Examples of the technique of compressing the image include forming a compressed image in the peripheral display region 10D by compressing display signals which are to be supplied to the pixels arrayed in the peripheral display region 10D, and changing the interval of the pixels in the peripheral display region 10D (see Japanese Patent Application No. 2008-322964).

The image formed in the peripheral display region 10D is enlarged by the lens portion 52, so that the luminance decreases according to the rate of enlargement. Therefore, a difference in luminance may sometimes occur between the image displayed on the lens portion 52 and the image displayed on the flat portion 54. Such a difference in luminance can be improved by increasing the luminance of light entering the lens portion 52 relative to the luminance of light entering the flat portion 54. For example, the luminance difference can be improved by making the transmittance of the pixels in the central display region 10B lower than that of the pixels in the peripheral display region 10D or by making the luminance of light going out from the pixels in the peripheral display region 10D higher than the luminance of light going out from the pixels in the central display region 10B (Japanese Patent Application No. 2008-322964).

Figure 26:
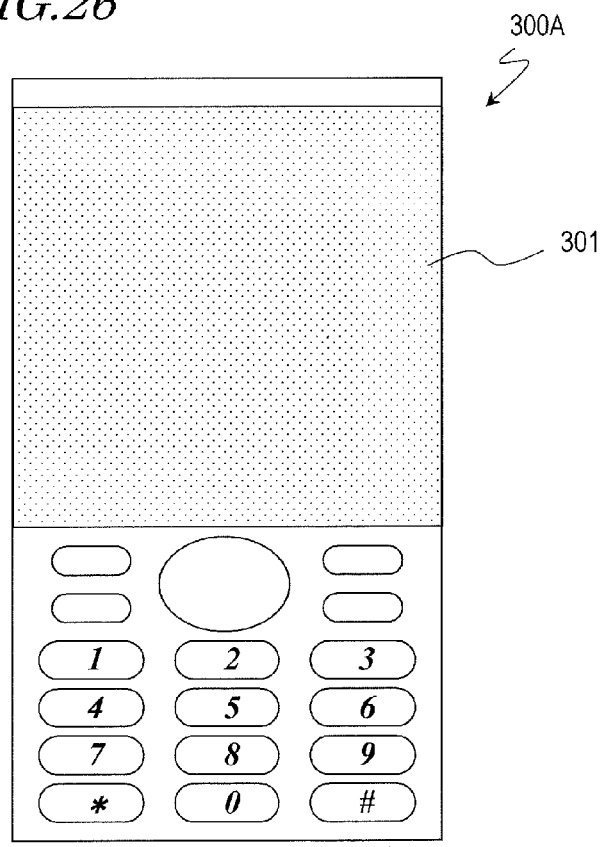
[FIG. 26] A diagram schematically showing a mobile phone 300A of an embodiment of the present invention.

The present invention may be applied to a mobile phone. FIG. 26 is a diagram schematically showing a mobile phone 300A in which the frame is visually obscured. FIG. 26 shows a region 301 in which an image is to be displayed. The mobile phone 300A has a lens portion that is similar to a lens portion with which an image can be displayed to the edges of the display device (for example, the lens portion 52 of the liquid crystal display device 100B (FIG. 4)), so that the frame portions at two sides can be visually obscured. In the mobile phone 300A, the lens portion enables displaying of an image to the edges on the two sides (region 301 in which an image is to be displayed).

The liquid crystal display devices of the above-described embodiments may be used as a digital photo frame. With the lens portions 52 provided at the four sides such that an image can be displayed up to the edges of the display device (e.g., the lens portions 52 of the liquid crystal display device 100B), a digital photo frame which displays an image over the entire surface is realized.

When the display device is used as a digital photo frame, an image of a frame may be displayed on the lens portion 52. By displaying the image of the frame on the lens portion 52, a digital photo frame of a novel configuration whose frame design is freely changeable is realized.

Figure 27:
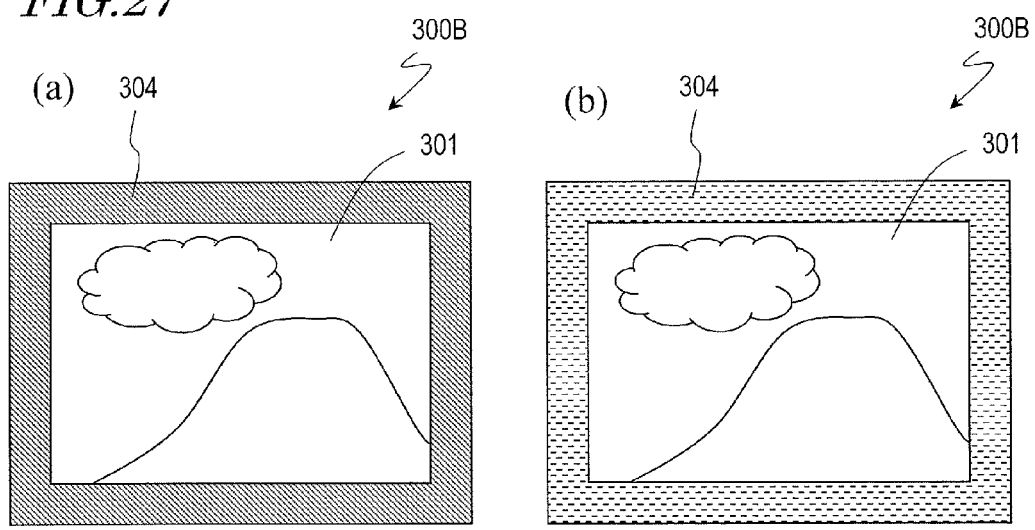
[FIG. 27] (*a*) and (*b*) are diagrams schematically showing a digital photo frame 300B of an embodiment of the present invention.

FIGS. 27(a) and 27(b) show a digital photo frame 300B in which an image of the frame is displayed on the lens portion 52. As shown in FIGS. 27(a) and 27(b), different frame images can be displayed in a region 304 extending over the lens portion of the digital photo frame 300B. The digital photo frame 300B is advantageous in that the frame design is freely changeable, although such a change of the frame is not possible in the conventional digital photo frames. The digital photo frame 300B can realize an enjoyable use such that, for example, the frame design is changed according to an image displayed at the center. Alternatively, only the image of the frame may be changed while the image at the center (the image displayed in the region 301 in FIGS. 27(a) and 27(b)) is kept unchanged. In this way, a user can select a favorite frame suitable to the image at the center. To the contrary, only the image at the center may be changed while the image of the frame is kept unchanged.

The displaying of the image of the frame on the lens portion 52 is realized by, for example, supplying display signals for the image of the frame to the pixels arrayed in the peripheral display region 10D. For example, it can readily be realized, without changing a conventional circuit configuration, by processing an image displayed in the display device by software as a combination of an image which is to be displayed at the center and an image of the frame. Alternatively, an additional driving circuit may be provided for supplying display signals to the pixels in the peripheral display region 10D, such that these pixels can be driven independently of the pixels in the central display region 10B. With this configuration, the frame can be freely changed irrespective of the image displayed at the center.

The width of the frame of the digital photo frame 300B can readily be changed. For example, the width of the frame can be made greater than the width of the lens portion 52 by, for example, supplying display signals for the image of the frame to the pixels arrayed in a region which includes the peripheral display region 10D and its neighborhoods.

When the digital photo frame 300B includes a backlight device, light of different intensities are emitted from the backlight device to the peripheral display region 10D and the central display region 10B, whereby the image of the frame and the image displayed at the center can have different luminances.

Note that such an arrangement that the image displayed on the lens portion (the image displayed in the peripheral display region) and the image displayed on the flat portion (the image displayed in the central display region) are images of different content types as in the digital photo frame 300B is also applicable to the above-described mobile phone and the above-described liquid crystal display devices.

As a matter of course, any information other than the image of the frame, such as ornamental patterns, characters, date and time, simple text messages, etc., may be displayed on the lens portion.

The region in which the image of the frame is to be displayed (a region including the peripheral display region 10D and an area surrounding the peripheral display region 10D) and the region in which the center image is to be displayed (the central display region 10B) may have different resolutions of the pixels. For example, when the image of the frame is a simple ornamental pattern or the like, the resolution of the peripheral display region 10D may be decreased. When a text message is displayed in a small font size, the resolution of the peripheral display region 10D may be increased.

According to the above-described embodiment of the present invention, a direct-viewing type liquid crystal display device is provided which includes a sole display panel, in which the frame is visually obscured, and in which the display region can be altered into a transparent state.

Next, an embodiment of a liquid crystal display device is described which is capable of achieving the above-described effects no matter which side of the liquid crystal display device is observed. The previous embodiments have been described only with a situation that the display device is observed on the front side (the upper side of the diagram). The liquid crystal display devices of the above embodiments may be transformed such that another set of the structure provided on the upper side of the liquid crystal display panel 10 is provided on the lower side to form a vertically symmetric structure, which is symmetrical about the liquid crystal display panel 10 between the upper side and the lower side. As a result, a direct-viewing type liquid crystal display device can be obtained which is observable on both sides of the liquid crystal display device, in which the frame is visually obscured no matter which side of the liquid crystal display device is observed, and in which the display region can be altered into a transparent state.

Figure 28:
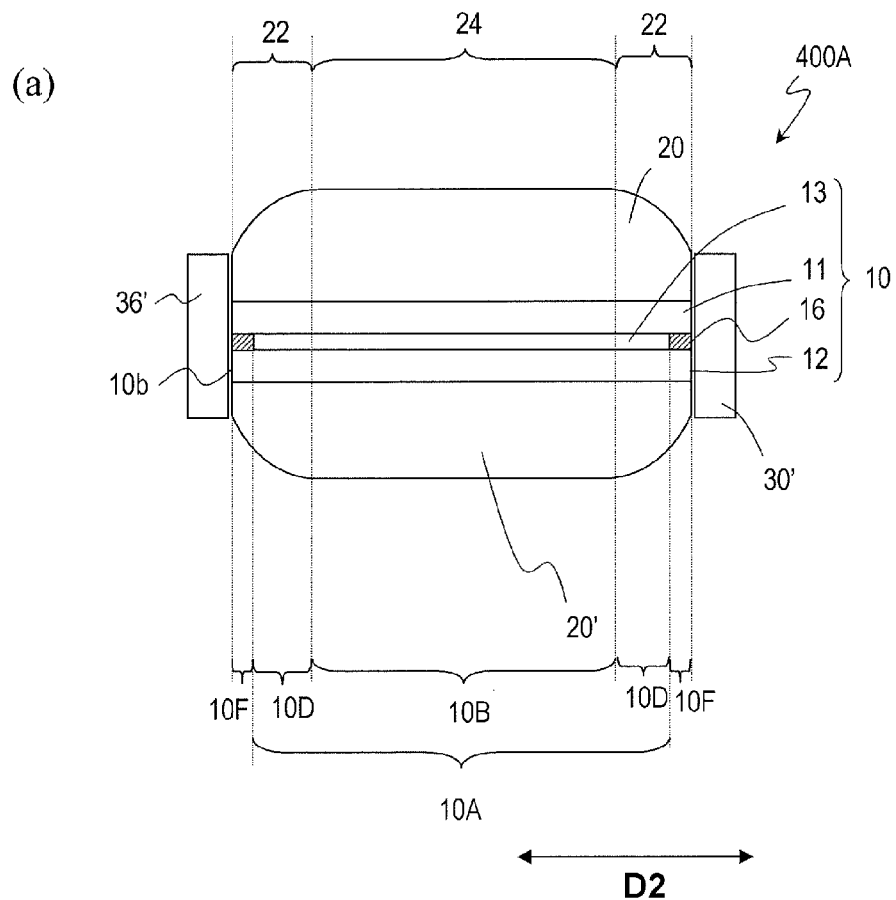
[FIG. 28] (*a*) is a schematic cross-sectional view of a liquid crystal display device 400A of an embodiment of the present invention. (*b*) is a diagram which illustrates the observability of a liquid crystal display device 400 on both sides.
Figure 28:
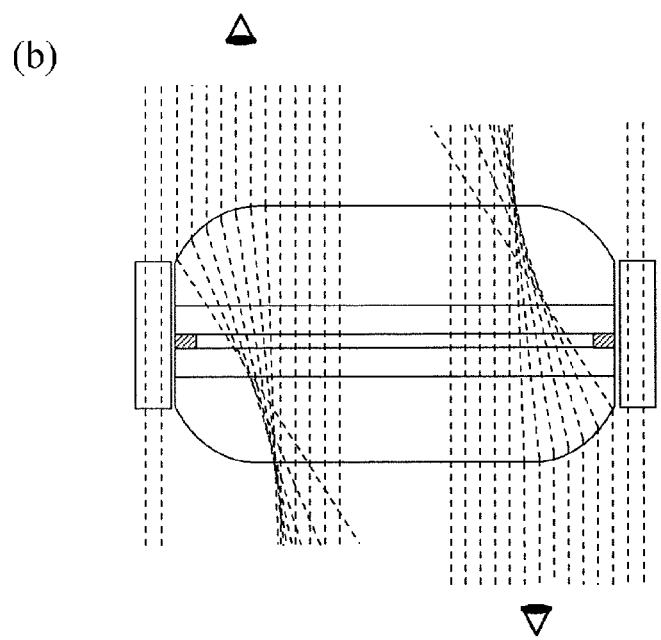

For example, a liquid crystal display device 400A shown in FIG. 28(a) basically corresponds to a structure obtained by transforming the structure of the liquid crystal display device 100A shown in FIG. 1 into a vertically symmetric structure, which is symmetrical about the liquid crystal display panel 10 between the upper side and the lower side. Thus, the liquid crystal display device 400A includes a sole liquid crystal display panel 10, a light-transmitting cover 20 provided on the front side of the liquid crystal display panel 10, a light-transmitting cover 20' provided on the rear side of the liquid crystal display panel 10, and a housing 30'. The light-transmitting cover 20' has the same structure as that of the light-transmitting cover 20. The light-transmitting covers 20, 20' are provided vertically symmetrically about the liquid crystal display panel 10.

The housing 30' is different from the housing 30 shown in FIG. 1 in that it only includes a lateral housing portion 36' (and does not include the bottom housing portion 38). The lateral housing portion 36' is capable of transmitting light and protects a side surface 10b of the liquid crystal display panel 10. The housing 30' may be secured to the liquid crystal display panel 10 using a known method. Note that it may be ensured that the optical paths of light rays passing through the housing 30' and the light-transmitting covers 20 and 20' are not interrupted.

As appreciated from FIG. 28(b), light rays are bent as shown by the lens portions 22 of the light-transmitting covers 20 and 20', so that the frame is not perceived no matter which side of the liquid crystal display device is observed. Therefore, when the liquid crystal display panel 10 is altered into a transparent state, the frame and the display region appear transparent no matter which side of the liquid crystal display device 400A is observed.

Figure 29:
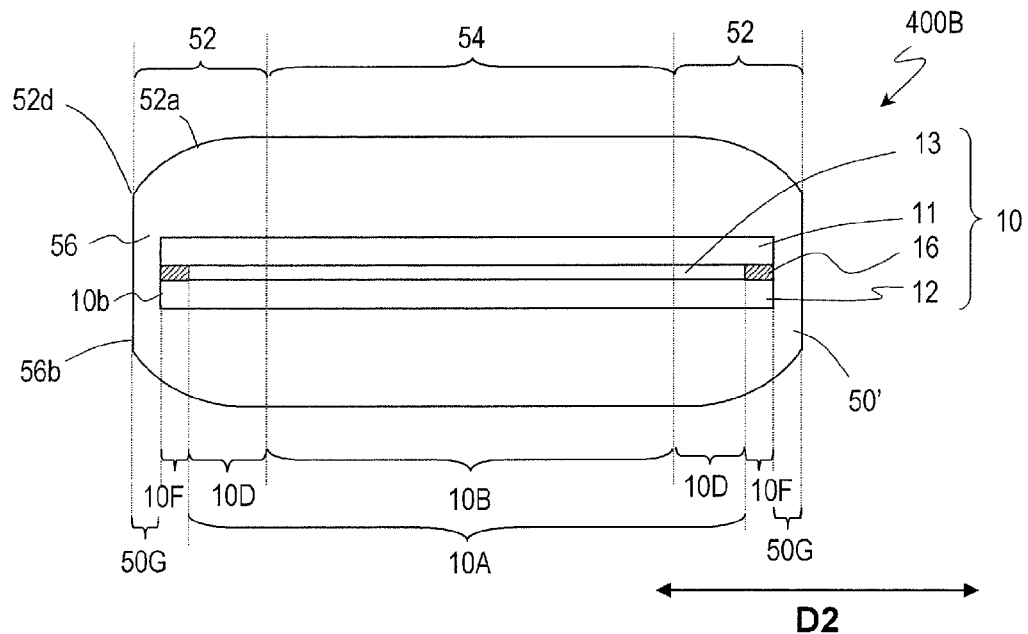
[FIG. 29] A schematic cross-sectional view of a liquid crystal display device 400B of an embodiment of the present invention.

A liquid crystal display device 400B shown in FIG. 29 basically corresponds to a structure obtained by transforming the structure of the liquid crystal display device 100B shown in FIG. 4 into a vertically symmetric structure, which is symmetrical about the liquid crystal display panel 10 between the upper side and the lower side. Thus, the liquid crystal display device 400B includes a sole liquid crystal display panel 10 and a lens-integrated housing 50'. The lens-integrated housing 50' is different from the lens-integrated housing 50 shown in FIG. 4. The lens-integrated housing 50' has a vertically symmetric structure, which is symmetrical about the liquid crystal display panel 10 between the upper side and the lower side.

Figure 30:
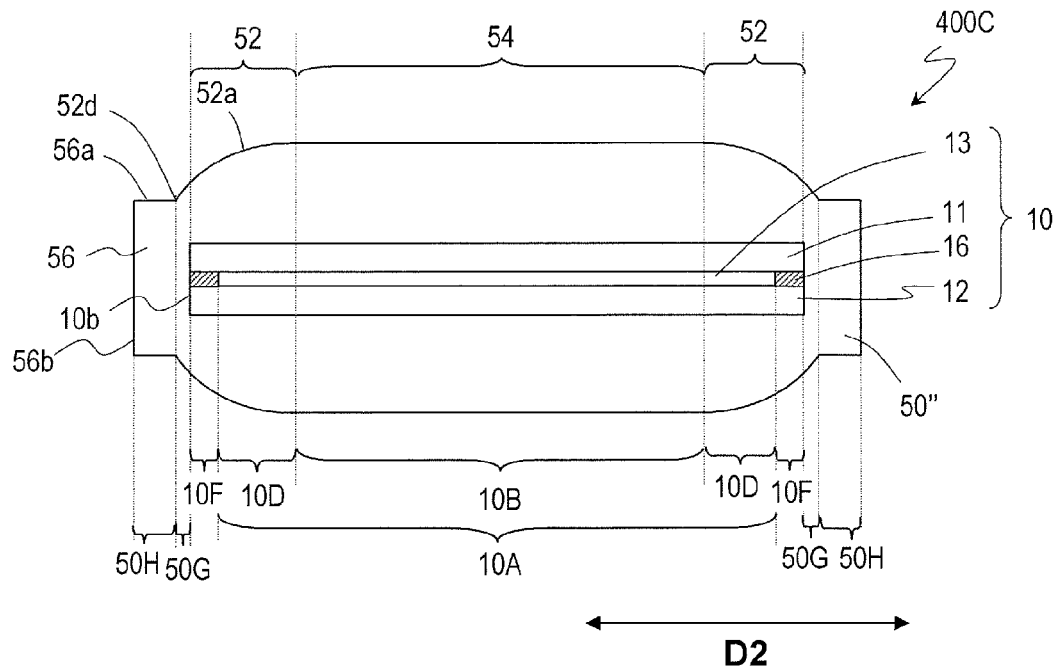
[FIG. 30] A schematic cross-sectional view of a liquid crystal display device 400C of an embodiment of the present invention.

A liquid crystal display device 400C shown in FIG. 30 basically corresponds to a structure obtained by transforming the structure of the liquid crystal display device 100C shown in FIG. 7 into a vertically symmetric structure, which is symmetrical about the liquid crystal display panel 10 between the upper side and the lower side. Thus, the liquid crystal display device 400C includes a sole liquid crystal display panel 10 and a lens-integrated housing 50". The lens-integrated housing 50" is different from the lens-integrated housing 50 shown in FIG. 7. The lens-integrated housing 50" has a vertically symmetric structure, which is symmetrical about the liquid crystal display panel 10 between the upper side and the lower side.

Thus, by transforming the light-transmitting cover or the lens-integrated housing into a vertically symmetric structure, which is symmetrical about the liquid crystal display panel 10 between the upper side and the lower side, a direct-viewing type liquid crystal display device can be obtained which is observable on both sides of the liquid crystal display device, in which the frame is visually obscured no matter which side of the liquid crystal display device is observed, and in which the display region can be altered into a transparent state. As a matter of course, part of the device which does not affect the optical paths does not need to have a vertically symmetric shape. Also, the light-transmitting covers or the lens-integrated housings do not need to have perfectly equal shapes (perfectly vertically symmetrical). For example, the upper half of the liquid crystal display panel 10 may have the shape of the lens-integrated housing 50 of the liquid crystal display device 100D shown in FIG. 10, while the lower half may have the shape of the lens-integrated housing 50 of the liquid crystal display device 100E shown in FIG. 11.

Figure 31:
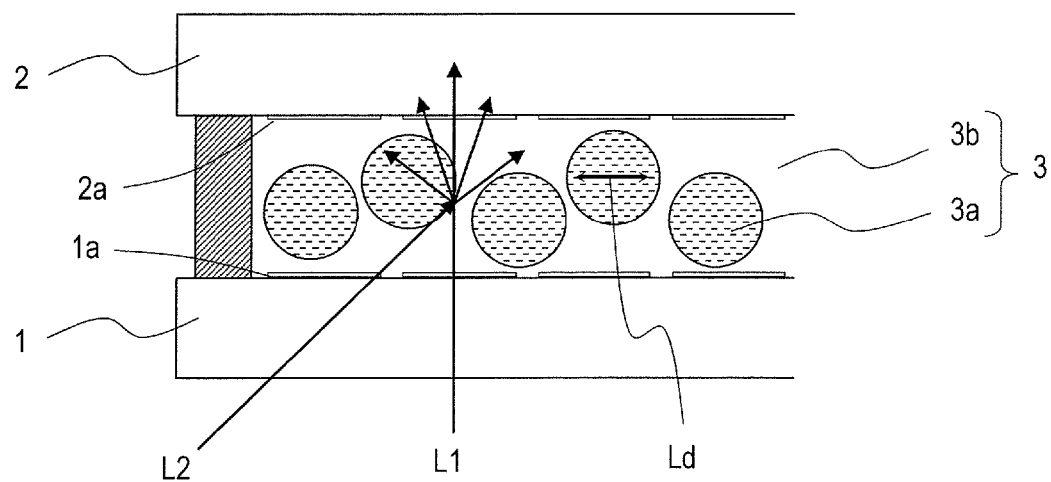
[FIG. 31] Cross-sectional views schematically showing the configuration of a polymer-dispersed liquid crystal display panel 10P for use in a liquid crystal display device of an embodiment of the present invention. (*a*) shows a state of the panel in the absence of an applied voltage. (*b*) shows a state of the panel in the presence of an applied voltage.
Figure 31:
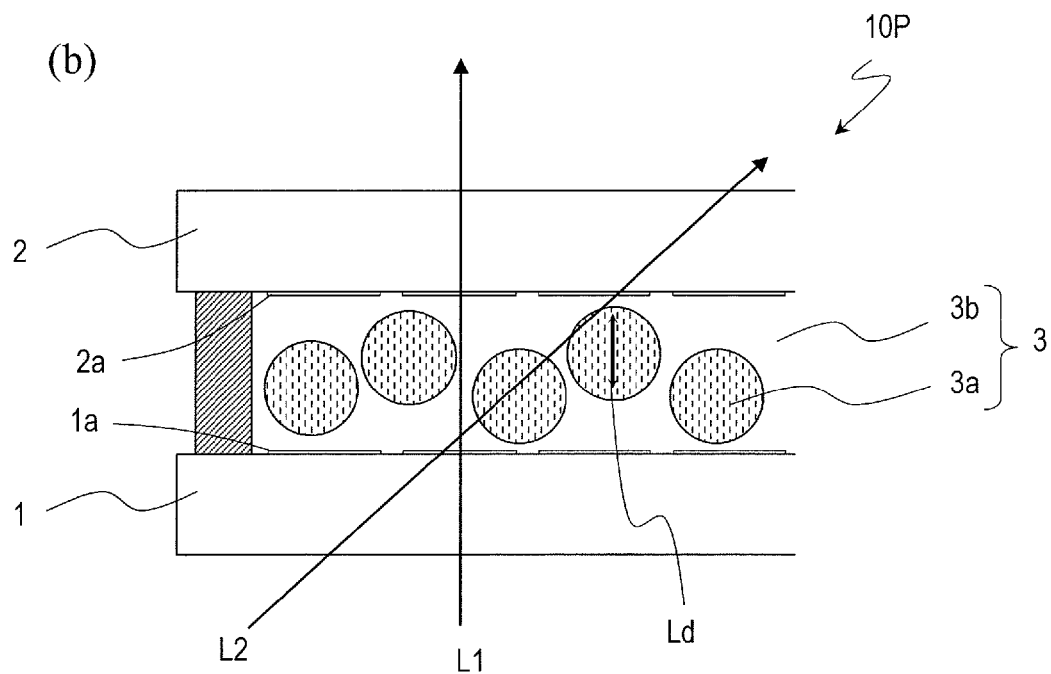

Next, a polymer-dispersed liquid crystal display panel (abbreviated as "PDLC display panel") 10P which may be used in the above-described liquid crystal display devices of the embodiments of the present invention is described with reference to FIG. 31. FIGS. 31(a) and 31(b) are cross-sectional views schematically showing the configuration of the PDLC display panel 10P. FIG. 31(a) shows a state of the panel in the absence of an applied voltage. FIG. 31(b) shows a state of the panel in the presence of an applied voltage.

The PDLC display panel 10P includes a transparent substrate 1, a transparent substrate 2, and a liquid crystal layer 3 interposed therebetween. The transparent substrates 1 and 2 have electrodes 1a and 2a, respectively, on the liquid crystal layer 3 side. The liquid crystal layer 3 includes liquid crystal droplets 3a and a polymer matrix 3b enclosing the liquid crystal droplets 3a. The liquid crystal layer 3 may be formed according to a known method, using a photocurable resin and a nematic liquid crystal material of positive dielectric anisotropy. The PDLC display panel 10P does not have polarizers, unlike common liquid crystal display panels.

In the absence of an applied voltage across the liquid crystal layer 3, for example, liquid crystal molecules in the liquid crystal droplets 3a are aligned in planes which are parallel to the liquid crystal layer 3 (the substrates 1 and 2) as illustrated by arrow Ld in FIG. 31(a). Here, the extraordinary index ($n_e$) of the liquid crystal molecules is larger than the refractive index of the polymer matrix 3b. Incoming light L1 is scattered by the liquid crystal layer 3 due to the difference in refractive index between the liquid crystal droplets 3a and the polymer matrix 3b. Therefore, when light transmitted through the liquid crystal layer 3 is observed, it appears to be in a whitish, non-transparent state.

On the other hand, in the presence of a sufficiently high voltage applied across the liquid crystal layer 3, the liquid crystal molecules in the liquid crystal droplets 3a are oriented parallel to the direction normal to the liquid crystal layer 3 as designated by Ld in FIG. 31(b). Here, the ordinary index ($n_o$) of the liquid crystal molecules is set approximately equal to the refractive index of the polymer matrix 3b, so that incoming light L1 is transmitted through the liquid crystal layer 3 without being scattered by the interface between the liquid crystal droplets 3a and the polymer matrix 3b. Therefore, when light transmitted through the liquid crystal layer 3 is observed, the liquid crystal layer 3 appears transparent.

Thus, when the PDLC display panel 10P is used, a light-scattering state and a transparent state can be achieved. In this display mode, the light-scattering state (whitish state) corresponds to white, and the transparent state corresponds to black. Further, intermediate voltages may be applied so that grayscale displaying can be achieved.

With only the PDLC display panel 10P, displaying in a dark environment cannot be achieved. In view of such, the PDLC display panel 10P may be combined with a light source.

Figure 32:
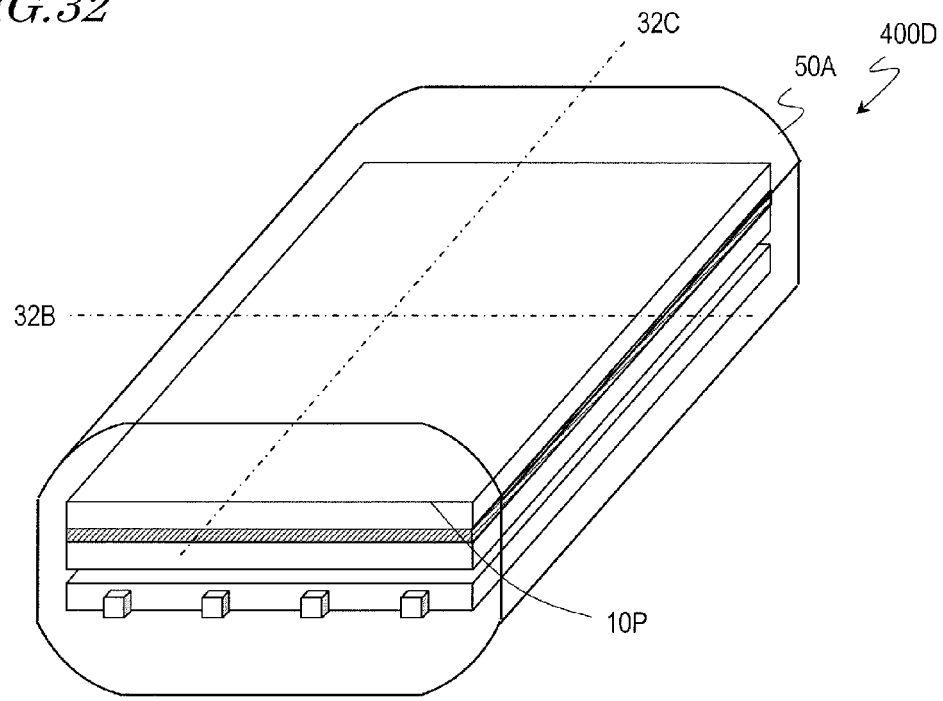
[FIG. 32] Diagrams showing the configuration of a liquid crystal display device 400D of an embodiment of the present invention. (*a*) is a schematic perspective view. (*b*) is a schematic cross-sectional view taken along line 32B of (*a*). (*c*) is a schematic cross-sectional view taken along line 32C of (*a*).
Figure 32:
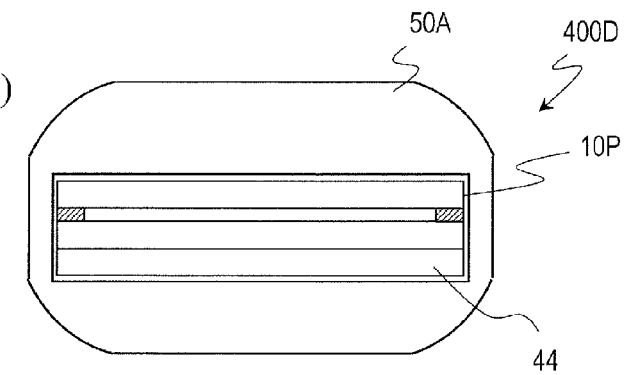
Figure 32:
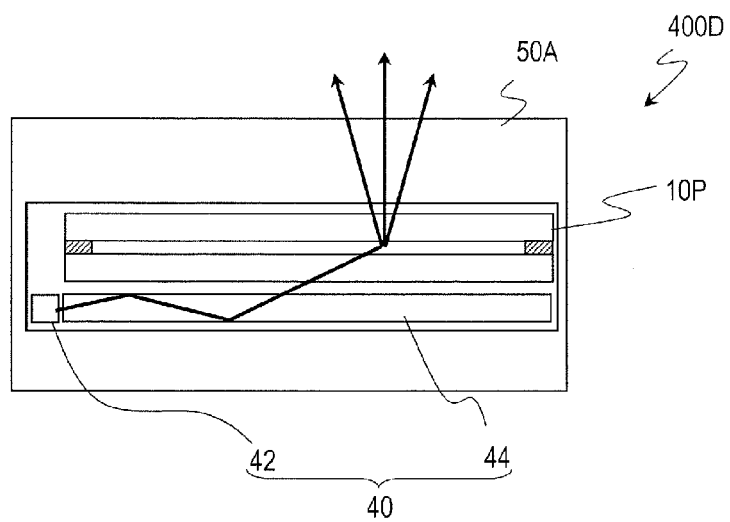

For example, FIGS. 32(a) to 32(c) show the configuration of a liquid crystal display device 400D of an embodiment of the present invention. FIG. 32(a) is a schematic perspective view of the liquid crystal display device 400D. FIG. 32(b) is a schematic cross-sectional view taken along line 32B of FIG. 32(a). FIG. 32(c) is a schematic cross-sectional view taken along line 32C of FIG. 32(a).

The liquid crystal display device 400D includes a PDLC display panel 10P, a backlight device 40, and a lens-integrated housing 50A.

The backlight device 40, which is provided on the rear side of the PDCL display panel 10P, includes light sources 42 and a light guide plate 44. The light sources 42 are, for example, LEDs. Light emitted from the light sources enters the light guide plate 44 at its side face and propagates through the light guide plate 44. Part of the propagating light goes out toward the PDCL display panel 10P and is used for displaying. Other examples of the light sources used herein include a cold-cathode tube, a hot-cathode tube, an organic EL device, and an inorganic EL device.

Here, unlike common backlight devices, an element which is capable of increasing the light utilization efficiency, such as a reflector, or the like, is not provided on the rear side of the light guide plate 44. Should a reflector be provided on the rear side of the light guide plate 44, the display would not become transparent even when the PDCL display panel 10P is altered into a transparent state, because light reflected by the reflector is observed.

Unlike the light guide plates of common backlight devices, the light guide plate 44 is preferably configured such that light goes out in directions inclined from the normal direction to the liquid crystal layer of the PDCL display panel 10P (i.e., the display plane) as illustrated in FIG. 32(c). In the absence of an applied voltage, as is the light ray L2 of FIG. 31(a), an incoming light ray L2 traveling in a direction inclined from the normal direction of the liquid crystal layer 3 of the PDCL display panel 10P is scattered by the liquid crystal layer 30, and part of the scattered light goes out toward the viewer's side (in a direction normal to the liquid crystal layer 3). In the presence of an applied voltage, as is the light ray L2 of FIG. 31(b), a light ray passes through the liquid crystal layer 3 and goes out in an oblique direction. Therefore, since the sight line of the viewer of the liquid crystal display device 400D is generally perpendicular to the liquid crystal layer 3, the display appears brighter in the absence of an applied voltage than in the presence of an applied voltage.

The light guide plate 44 that emits light in directions inclined from the normal direction of the liquid crystal layer 3 of the PDCL display panel 10P may be realized by a transparent parallel plate which is made of, for example, an acrylic resin. For example, when the display region has the size of about 4 inches, using an acrylic plate having a thickness of about 1 mm to 2 mm as the light guide plate 44 can achieve an appropriate light outgoing angle (about 40° to 80° from the normal to the display plane of the PDCL display panel 10P). Note that, preferably, the surface of the light guide plate 44 is not provided with, for example, dot print marks of a white ink which are usually employed in common backlight devices. This is because transparency is not achieved due to the white dots of the light guide plate 44 even when the PDCL display panel 10P is altered into a transparent state. The light guide plate 44 that has a roughened surface may be used because a transmitted image (rear environment) is less readily perceived when the PDCL display panel 10P is altered into a transparent state but appears transparent.

In the example described herein, the backlight device 40 is provided only at the rear side of the PDCL display panel 10P. However, as a matter of course, another backlight device 40 may be provided on the front side of the PDCL display panel 10P in the same way. The light guide plate 44 may have a wedge-shaped cross section such that a portion of the light guide plate 44 which is more distant from the light sources has a smaller thickness. As a matter of course, a light guide plate which has a symmetric cross-sectional shape may be used with light sources being positioned on opposite sides of the light guide plate.

Figure 33:
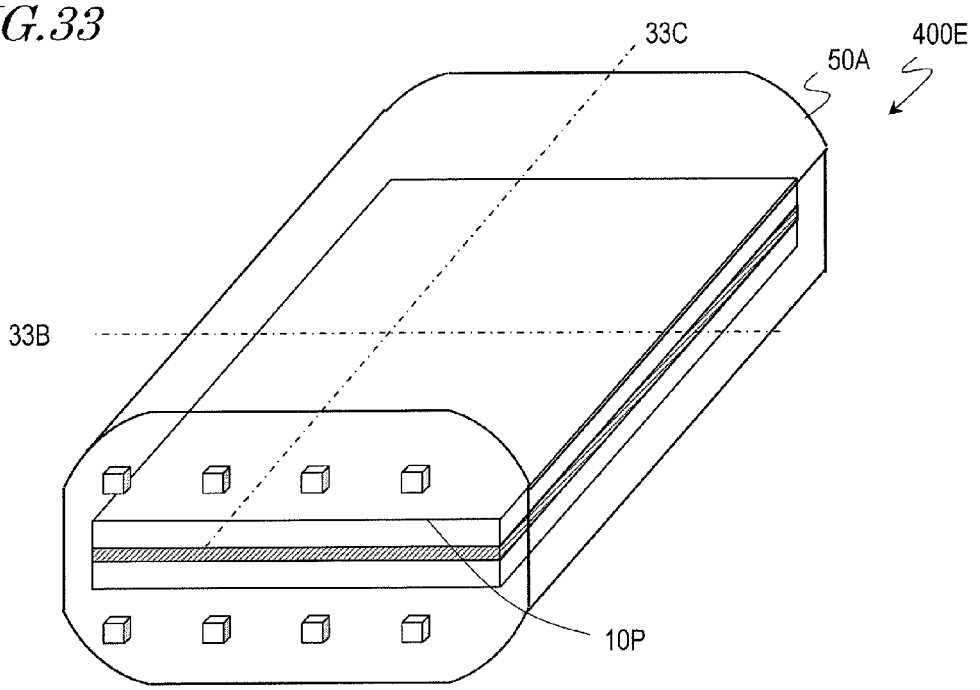
[FIG. 33] Diagrams showing the configuration of a liquid crystal display device 400E of an embodiment of the present invention. (*a*) is a schematic perspective view. (*b*) is a schematic cross-sectional view taken along line 33B of (*a*). (*c*) is a schematic cross-sectional view taken along line 33C of (*a*).
Figure 33:
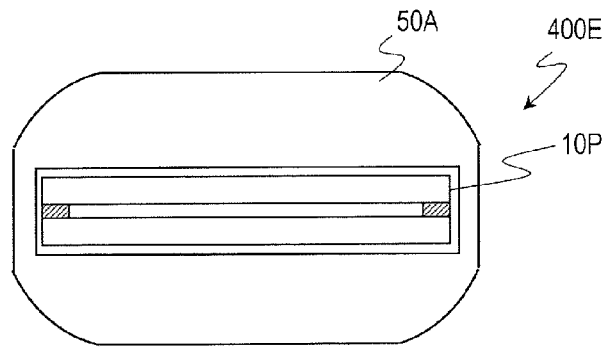
Figure 33:
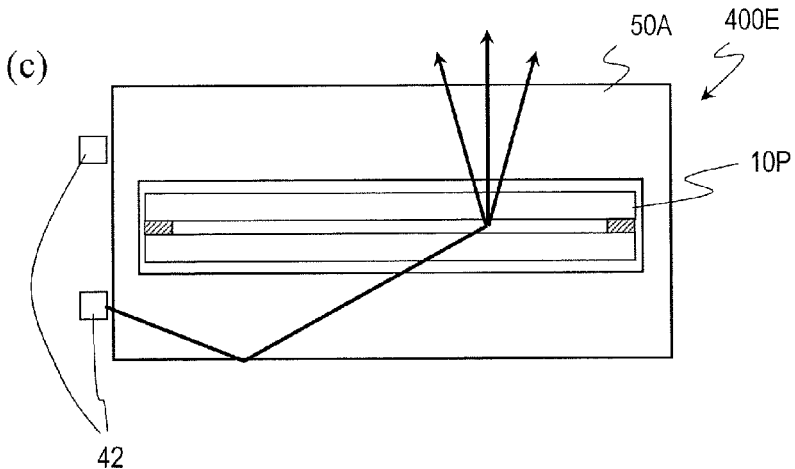

FIGS. 33(a) to 33(c) show the configuration of a liquid crystal display device 400E of an embodiment of the present invention. FIG. 33(a) is a schematic perspective view of the liquid crystal display device 400E. FIG. 33(b) is a schematic cross-sectional view taken along line 33B of FIG. 33(a). FIG. 33(c) is a schematic cross-sectional view taken along line 33C of FIG. 33(a).

The liquid crystal display device 400E includes a PDLC display panel 10P, light sources 42, and a lens-integrated housing 50A. The liquid crystal display device 400E is different from the above-described liquid crystal display device 400D in that it does not include a light guide plate.

As shown in FIG. 33(c), light emitted from the light sources (e.g., LEDs) 42 enters the lens-integrated housing 50A at its side face and goes out in a direction inclined from the normal direction of the liquid crystal layer of the PDLC display panel 10P (display plane). In this way, the lens-integrated housing 50A can be used as a light guide plate. Note that the number and positions of the light sources 42 may be arbitrary. It is however preferred that the light sources 42 are provided in a vertically symmetric arrangement, which is symmetrical about the liquid crystal display panel 10 between the upper side and the lower side. This is because equivalent displaying can be achieved no matter which side of the liquid crystal display device 400E is observed. As a matter of course, the effects of the present invention are not marred even when the light sources 42 are provided in a vertically asymmetric arrangement about the liquid crystal display panel 10.

The lens-integrated housing 50A that the liquid crystal display devices 400D and 400E include has the same shape as that of the lens-integrated housing 50' shown in FIG. 29, although the present invention is not limited to this example.

The lens-integrated housing 50A may have a different shape. Alternatively, as a matter of course, it may be realized by a light-transmitting cover and a housing which are separate pieces. Although in the above example a liquid crystal display device which is observable on both sides is combined with light sources (and a light guide plate), the previously-described liquid crystal display device which is observable only on one side may be, as a matter of course, combined with light sources (and a light guide plate).

Each of the liquid crystal display devices of the above-described embodiments includes a sole liquid crystal display panel, although a liquid crystal display device of an embodiment of the present invention is not limited to the above examples. It may be realized by a plurality of liquid crystal display panels which are combined together using a tiling technique.

Figure 34:
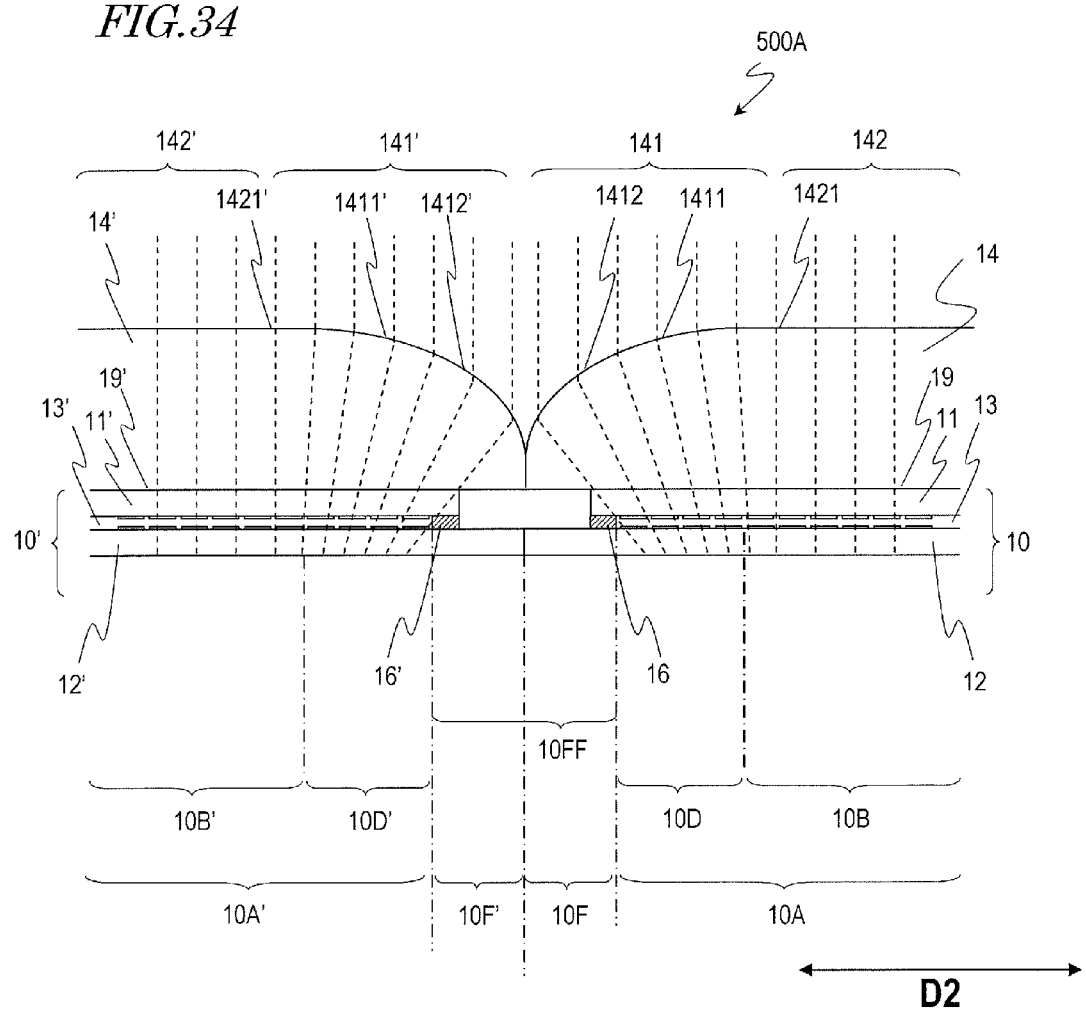
[FIG. 34] A schematic partial cross-sectional view of a liquid crystal display device 500A of an embodiment of the present invention.

FIG. 34 shows a schematic cross-sectional view of a direct-viewing type liquid crystal display device 500A of an embodiment of the present invention. The liquid crystal display device 500A includes two liquid crystal display panels 10 and 10'. Herein, a liquid crystal display device is illustrated in which the liquid crystal display panels 10 and 10' are disposed so as to adjoin each other. Instead of the liquid crystal display panels 10 and 10', it is possible to use a liquid crystal displaying unit which is composed of the liquid crystal display panel 10 accommodated in a housing and a liquid crystal displaying unit which is composed of a liquid crystal display panel 10' accommodated in a housing, such that the liquid crystal displaying units are disposed so as to adjoin each other.

The liquid crystal display panels 10 and 10' include: display regions 10A and 10A' in which a plurality of pixels are arrayed; and frame regions 10F and 10F' lying outside the display regions 10A and 10A'. Any region not contributive to displaying will be collectively referred to as a non-display region 10FF. The non-display region 10FF includes the frame regions 10F and 10F', and if any gap or connecting portion exists therebetween, such a gap or connecting portion also belongs in the non-display region 10FF. In the display regions 10A and 10A' of the liquid crystal display panels 10 and 10', a plurality of pixels are placed in a matrix along a first direction (a direction normal to the sheet of FIG. 34) and a second direction, which is perpendicular to the first direction and parallel to the display planes 19 and 19' of the display panels 10 and 10' (direction D2 in FIG. 34). The pixels are arrayed at an equal pitch along each of the first direction and the second direction.

The liquid crystal display panel 10 includes an upper substrate 11 and a lower substrate 12, with a liquid crystal layer 13 being provided between the upper substrate 11 and the lower substrate 12. A color filter layer and a counter electrode are formed on the upper substrate 11, for example. On the lower substrate 12, transparent electrodes are formed in a matrix shape, for example, and also, TFTs, bus lines, driving circuits for supplying signals thereto, and the like are provided. Included in the frame region 10F of the liquid crystal display panel 10 are a sealing portion 16 for allowing the liquid crystal layer 13 to be retained between the upper substrate 11 and the lower substrate 12, driving circuitry for driving the pixels, and the like. In the liquid crystal display panel 10', an upper substrate 11', a lower substrate 12', a liquid crystal layer 13', and a sealing portion 16' are provided, as in the liquid crystal display panel 10.

The light-transmitting covers 14 and 14' are disposed on the viewer's side of the liquid crystal display panels 10 and 10'. The light-transmitting covers 14 and 14' include lens portions 141 and 141' and flat plate portions 142 and 142'. The lens portions 141 and 141' and the flat plate portions 142 and 142' differ from each other in terms of the shape of their viewer-side surfaces.

The lens portion 141 is disposed astride the boundary extending along the first direction between the display region 10A and the frame region 10F of the liquid crystal display panel 10. Similarly, the lens portion 141' is disposed astride the boundary extending along the first direction between the display region 10A' and the frame region 10F' of the liquid crystal display panel 10'. Stated otherwise, the lens portion 141 is on the viewer's side of a region including a portion of the frame region 10F and a portion of a peripheral display region 10D within the display region 10A that adjoins the portion of the frame region 10F along the second direction. Similarly, the lens portion 141' is on the viewer's side of a region including a portion of the frame region 10F' and a portion of a peripheral display region 10D' within the display region 10A' that adjoins the portion of the frame region 10F' along the second direction.

Light which goes out from pixels which are arrayed in the central display regions 10B and 10B' of the liquid crystal display panels 10 and 10' enters the flat plate portions 142 and 142', goes straight through the flat plate portions 142 and 142' in a direction which is perpendicular to the display planes 19 and 19' of the liquid crystal display panels 10 and 10' so as to go out on the viewer's side, and travels in a direction which is perpendicular to the display planes 19 and 19'. Light which goes out from pixels which are arrayed in the peripheral display regions 10D and 10D' enters the lens portions 141 and 141', and is refracted outside (toward a border line between the liquid crystal display panels 10 and 10') so as to go out on the viewer's side, and travels in a direction which is perpendicular to the display planes 19 and 19'. In this manner, as the light emitted from the peripheral display regions 10D and 10D' of the liquid crystal display panels 10 and 10' is refracted, an image is displayed on the front faces of the frame regions 10F and 10F'. Thus, the frame regions 10F and 10F', i.e., the non-display region 10FF which might have appeared as a joint in the image in the case of tiling, can be visually obscured.

The surface shape of the lens portions 141 and 141' of the light-transmitting covers 14 and 14' is designed, for example, in the same way as the surface shape of the lens 22 of the light-transmitting cover 20 shown in FIG. 2 (see Japanese Patent Application No. 2008-166458).

For example, instead of the liquid crystal display panel 10 and the light-transmitting cover 20 in the liquid crystal display device 100A shown in FIG. 2, a liquid crystal display device 500A is used, and the shape of the outer frame region of the light-transmitting covers 14 and 14' is equal to that of the lens portion 22. As a result, a direct-viewing type liquid crystal display device is obtained which has liquid crystal display panels combined using a tiling technique, in which the frame is visually obscured, and in which the display region can be altered into a transparent state.

Figure 35:
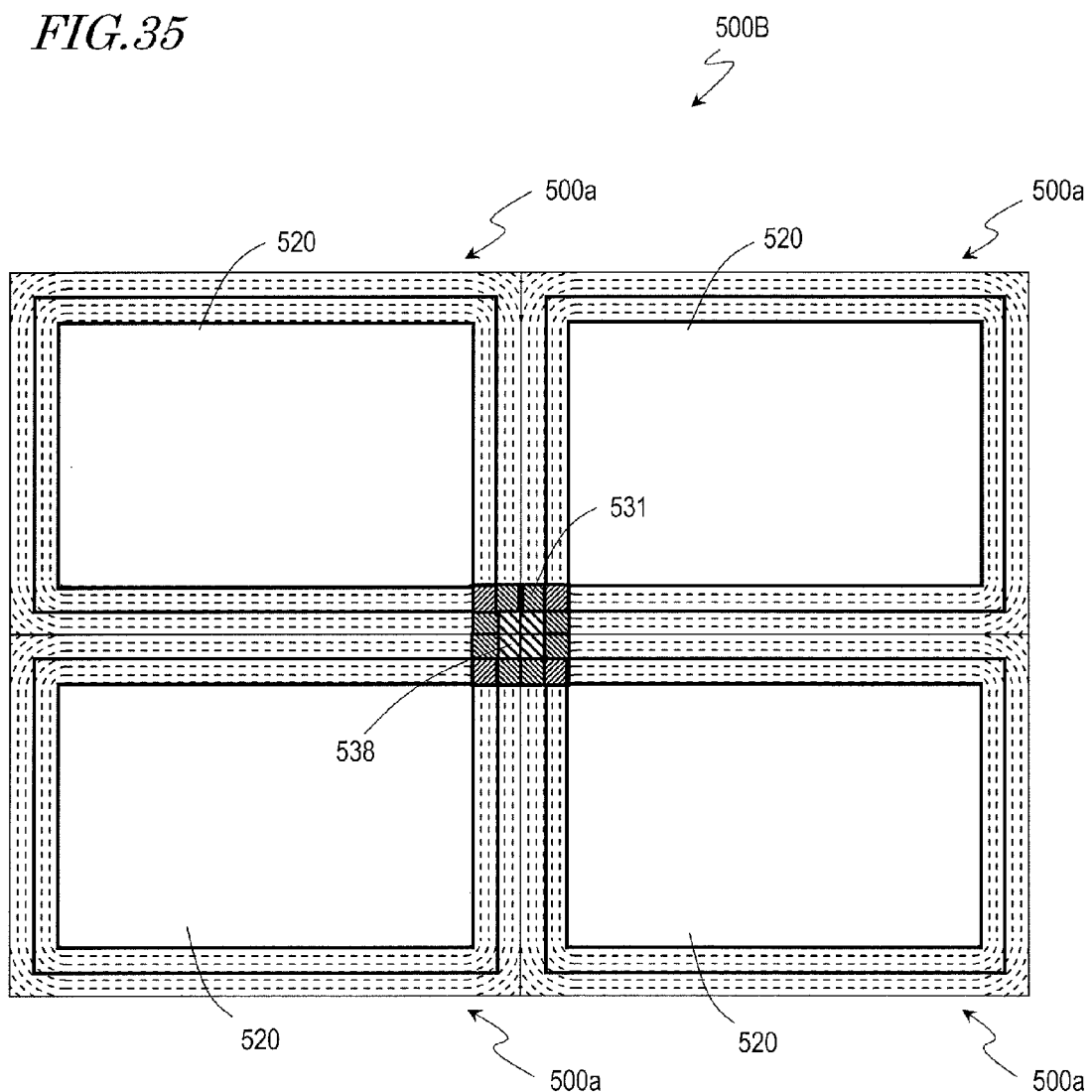
[FIG. 35] A schematic plan view of a liquid crystal display device 500B of an embodiment of the present invention.
Figure 36:
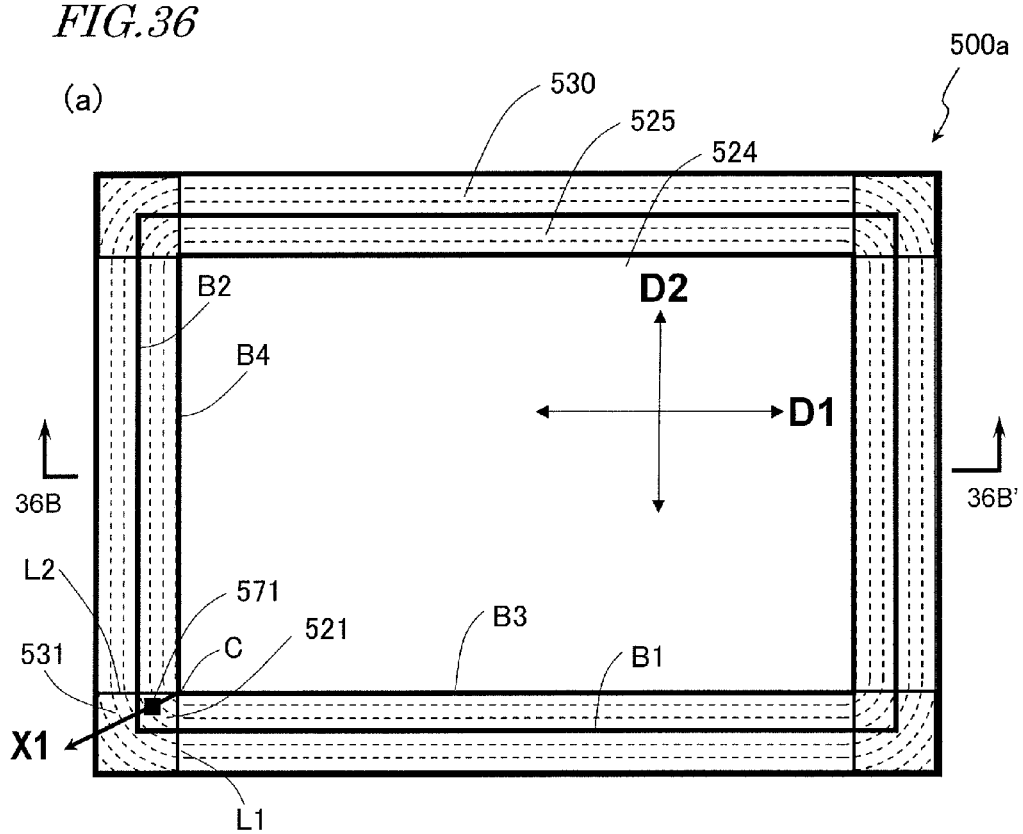
[FIG. 36] (a) and (b) are diagrams showing the configuration of a liquid crystal display device 500a which is for use in a liquid crystal display device 500B of an embodiment of the present invention. (a) is a schematic plan view. (b) is a schematic cross-sectional view taken along line 36B-36B' of (a).
Figure 36:
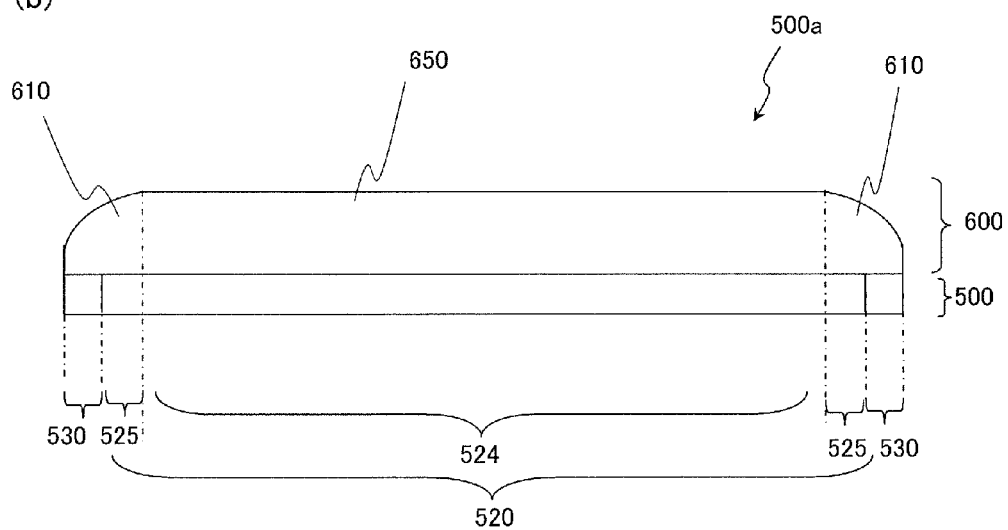
Figure 37:
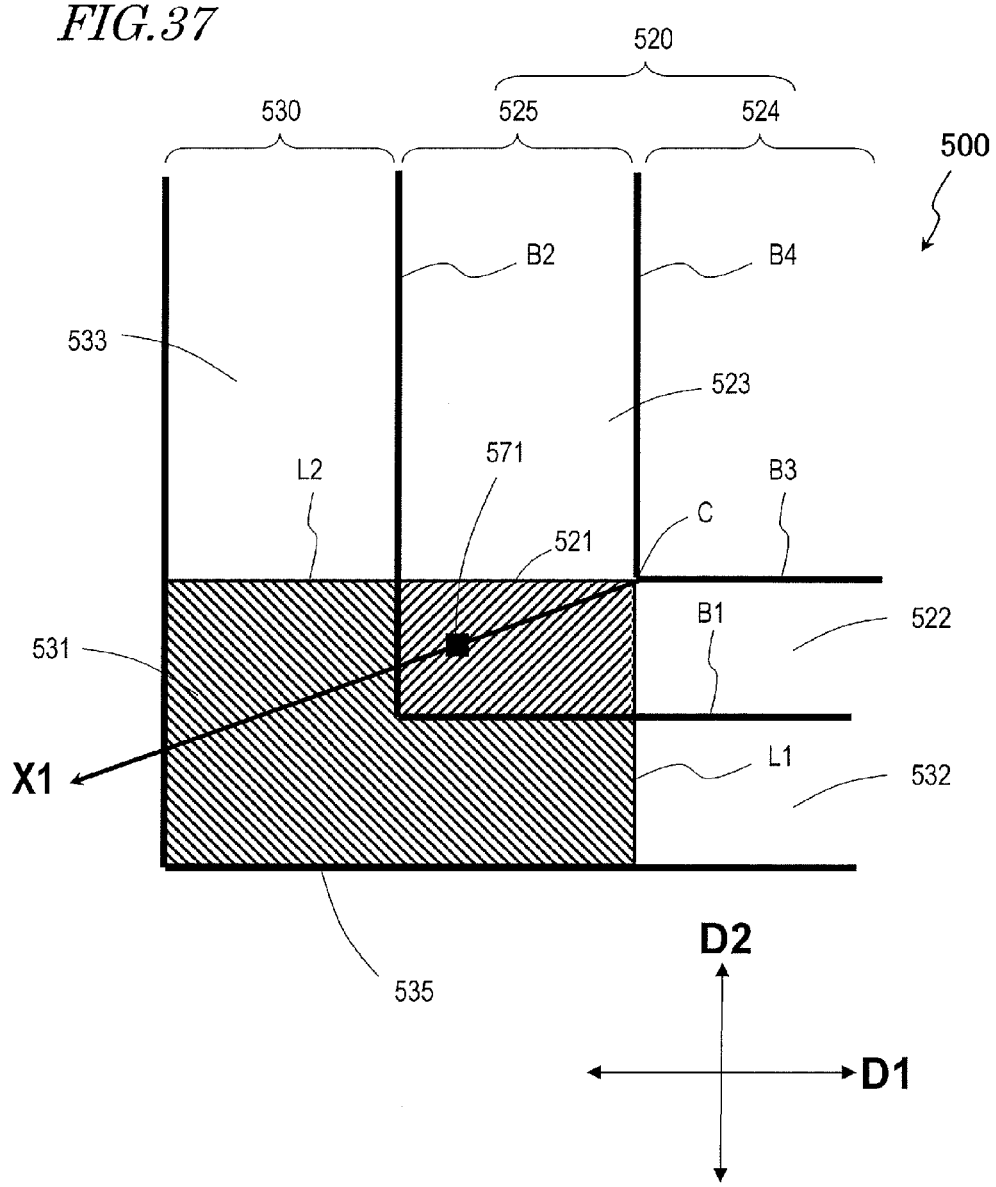
[FIG. 37] is a schematic top view of an edge portion of a liquid crystal display panel 500.

Alternatively, as in a liquid crystal display device 500B shown in FIG. 35, the liquid crystal display devices 500a may be combined using a tiling technique in two directions. FIG. 35 is a schematic plan view of the liquid crystal display device 500B of an embodiment of the present invention. FIGS. 36(a) and 36(b) are diagrams showing the configuration of the liquid crystal display device 500a which is used in the liquid crystal display device 500B. FIG. 36(a) is a schematic plan view. FIG. 36(b) is a schematic cross-sectional view taken along line 36B-36B' of FIG. 36(a). FIG. 37 is a schematic top view of an edge portion of a liquid crystal display panel 500.

Figure 38:
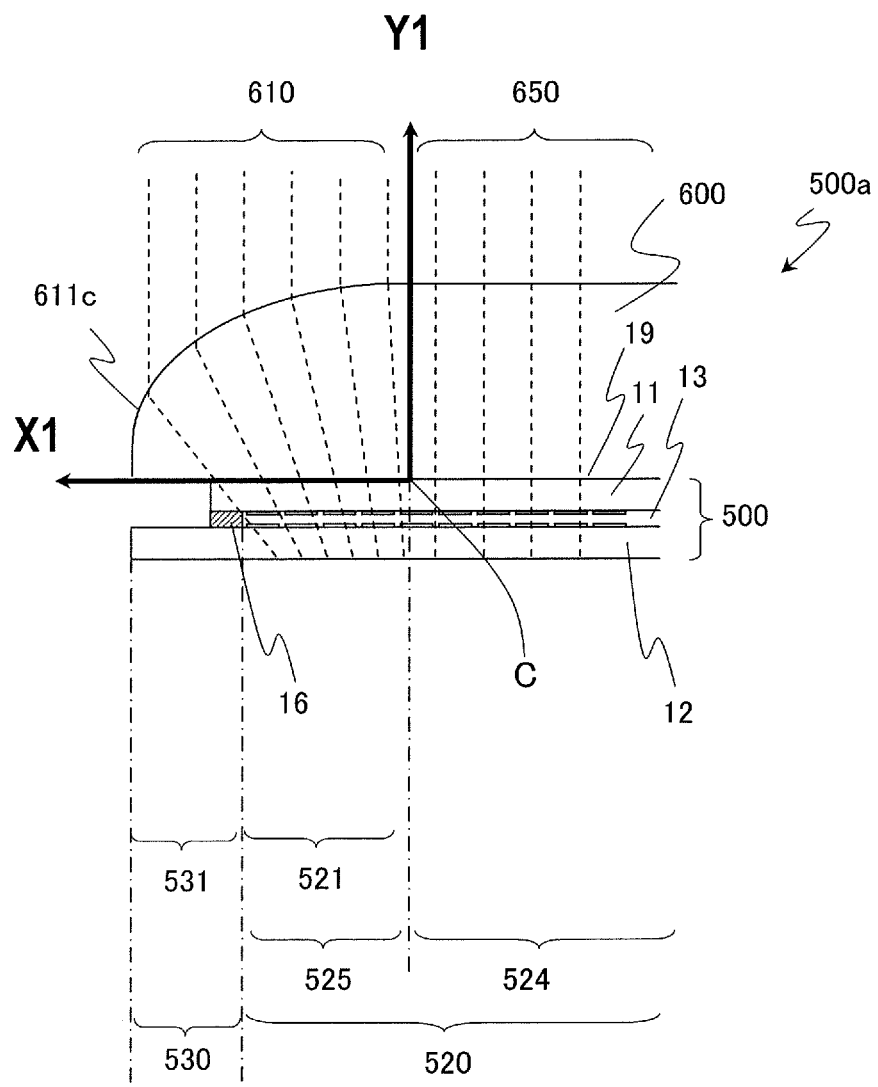

FIG. 38 is a schematic cross-sectional view of an edge portion of the liquid crystal display device 500a.

The liquid crystal display devices 500a are combined in two directions, vertical and horizontal directions, using a tiling technique (2×2), whereby a large-screen liquid crystal display device 500B shown in FIG. 35 can be obtained. In FIG. 35, contour lines are employed to illustrate the curved shape of the lens portions of the light-transmitting covers provided over the liquid crystal display devices 500a.

In order to realize jointless displaying with the liquid crystal display device 500B, boundary portions extending in the horizontal direction (first direction D1) and the vertical direction (second direction D2) which surround the display regions 520 of the liquid crystal display panels 500, as well as a non-display region 538 (shown with bold hatching in FIG. 35) at corners which are not included in any of the boundary portions, are obscured. As in the liquid crystal display device 200A shown in FIG. 24, a light-transmitting cover which has a lens portion that has a shape represented by, for example, a portion of a body of revolution may be provided over the corners of each of the liquid crystal display panels 500 (see Japanese Patent Application No. 2008-322964). Hereinafter, the configuration of the liquid crystal display device 500a is described with reference to FIG. 36 to FIG. 38.

As shown in FIGS. 36(a) and 36(b), the liquid crystal display device 500a includes a liquid crystal display panel 500 and a light-transmitting cover 600 which is provided on the viewer's side of the liquid crystal display panel 500. The liquid crystal display panel 500 includes a display region 520 in which a plurality of pixels are arranged in a matrix of rows and columns and a frame region 530 which is provided outside the display region 520. The display region 520 is constituted of a peripheral display region 525 that adjoins the frame region 530 and a central display region 524 that forms part of the display region 520 other than the peripheral display region 525. The light-transmitting cover 600 includes a flat portion 650 and a lens portion 610.

The peripheral display region 525 of the liquid crystal display panel 500 refers to part of the display region 520 in which the lens portion 610 of the light-transmitting cover 600 is provided at the viewer's side. The flat portion 650 is provided on the central display region 524. Light going out from the peripheral display region 525 is refracted by the lens portion 610 such that an image formed in the peripheral display region 525 is enlarged so as to be displayed over a region constituted of the peripheral display region 525 and the frame region 530.

Here, the row direction is referred to as "first direction D1", and the column direction is referred to as "second direction D2". Between the display region 520 and the frame region 530, there are a first boundary line B1 extending in the first direction D1 and a second boundary line B2 intersecting with the first boundary line B1 and extending in the second direction D2. Between the peripheral display region 525 and the central display region 524, there are a third boundary line B3 extending in the first direction D1 and a fourth boundary line B4 intersecting with the third boundary line B3 and extending in the second direction D2.

The peripheral display region 525 includes a first peripheral display portion 521 which is enclosed by a line L1, a line L2, the first boundary line B1, and the second boundary line B2. The line L1 is a line which passes through the point C where the third boundary line B3 and the fourth boundary line B4 intersect with each other and which is perpendicular to the first boundary line B1. The line L2 is a line which passes through the point C and which is perpendicular to the second boundary line B2.

The frame region 530 includes a first frame portion 531 which adjoins the first peripheral display portion 521 at the first boundary line B1 and the second boundary line B2. The first frame portion 531 is a portion which is defined by the first boundary line B1, the second boundary line B2, the line L1 and the line L2, and the perimeter of the liquid crystal display panel 500.

The lens portion 610 of the light-transmitting cover 600 has a curved surface as shown in FIG. 36(b). In FIG. 36(a), the curvature of the surface (viewer-side surface) of the lens portion 610 is expressed by contour lines. Note that, here, the interval of the contour lines is constant for the sake of simplicity, although the present invention is not limited to this example. A preferred shape of the viewer-side surface of the lens portion 610 will be described later in detail.

The lens portion 610 of the light-transmitting cover 600 of the liquid crystal display device 500a is configured to refract light going out from the first peripheral display portion 521 such that an image formed in the first peripheral display portion 521 is enlarged so as to be displayed over a region constituted of the first peripheral display portion 521 and the first frame portion 531. The lens portion 610 is configured to refract a light ray going out from a pixel 571 that is in the first peripheral display portion 521 along a direction from the point C to the pixel 571, i.e., along the direction X1, as shown in FIG. 36(a). Likewise, light rays going out from the pixels arrayed in the first peripheral display portion 521 are refracted along directions from the point C to the respective pixels. Therefore, when an image is observed in a direction perpendicular to the display surface of the liquid crystal display device 500a, an image formed in the first peripheral display portion 521 of the liquid crystal display panel 500 is enlarged so as to be displayed over a region constituted of the first peripheral display portion 521 and the first frame portion 531. Thus, part of the lens portion 610 provided over the first peripheral display portion 521 and the first frame portion 531 refracts light going out from the first peripheral display portion 521 along a direction which is not identical with the horizontal direction D1 or the vertical direction D2, e.g., X1, so that the first frame portion 531 is visually obscured.

Hereinafter, the configuration is more specifically described with reference to FIG. 37 and FIG. 38.

FIG. 37 is an enlarged top view schematically showing part of the liquid crystal display panel 500 in the vicinity of a corner portion. As shown in FIG. 37, there are the first boundary line B1 and the second boundary line B2 between the display region 520 and the frame region 530, and there are the third boundary line B3 and the fourth boundary line B4 between the peripheral display region 525 and the central display region 524. The first peripheral display portion 521 is a portion which is enclosed by the line L1, the line L2, the first boundary line B1, and the second boundary line B2. The first frame portion 531 is part of the frame region 530 which is enclosed by the line L1, the line L2, the first boundary line B1, the second boundary line B2, and an outer edge 535 of the frame region 530.

Next, refer to FIG. 38. FIG. 38 is a cross-sectional view of the liquid crystal display device 500a in a X1-Y1 plane. Here, Y1 axis is an axis which passes through the point C shown in FIG. 37 and which is perpendicular to the display surface 19 of the liquid crystal display panel 500.

In FIG. 38, broken lines represent light rays which go out from the pixels arrayed in the display region 520. As shown in FIG. 38, light rays going out from the pixels arrayed in the first peripheral display portion 521 impinge on the lens portion 610 and are refracted in the direction X1. Here, the light rays that have entered the lens portion 610 are refracted at the viewer-side surface (or "outgoing face") of the lens portion 610 and go out from the viewer-side surface of the lens portion 610 that is provided over the first peripheral display portion 521 and the first frame portion 531. The light rays going out of the viewer-side surface of the lens portion 610 travel straight in a direction perpendicular to the display surface 19. Thus, when observing an image in a direction perpendicular to the display surface 19 of the liquid crystal display device 500a, an image formed in the first peripheral display portion 521 of the liquid crystal display panel 500 is enlarged so as to be displayed over a region constituted of the first peripheral display portion 521 and the first frame portion 531, so that the first frame portion 531 cannot be seen.

Since the liquid crystal display device 500a has the lens portion 610 that corresponds to the entire frame region 530 of the liquid crystal display panel 500, the frame region 530 can be entirely obscured from a viewer. However, the present invention is not limited to this example, but only part of the frame region 530 (e.g., first frame portion 531) can be obscured. Note that, portions other than the corner portions, such as the first frame portion 531, may be obscured by any of the conventional methods. However, using a lens portion which is integrated as the light-transmitting cover 600 is preferred.

As described above, in each of the liquid crystal display devices 500a, the first frame portion 531 can be obscured. Therefore, since the non-display regions 538 of the liquid crystal display device 500A shown in FIG. 35 are included in the first frame portions 531 of the four liquid crystal display devices 500a, the non-display regions 538 can be obscured in the liquid crystal display device 500A.

As described above, since the liquid crystal display device 500a shown in FIG. 36(a) has the lens portion 610 that corresponds to the entire frame region 530 of the liquid crystal display panel 500, a jointless image can be displayed, and other frame portions than those extending at the joints can be obscured. Here, the liquid crystal display device 500A is capable of displaying an image of a still larger size.

FIG. 38 also shows light rays going out from the pixels arrayed in the central display region 524. The outgoing face of the flat portion 650 which is provided over the central display region 524 is parallel to the display surface 19. Light rays going out from the central display region 524 enter the flat portion 650 and travel straight across the flat portion 650 in a direction perpendicular to the display surface 19.

Next, a preferred shape of part of the lens portion 610 which is provided over the first peripheral display portion 521 and the first frame portion 531 (the first lens section 611) is described. The first lens section 611 is, preferably, part of a body of revolution which is obtained by cutting the body of revolution at two planes that include the axis of revolution. Here, this part of the body of revolution is preferably positioned such that the axis of revolution is coincident with Y1 axis. That is, it is preferably positioned such that the axis of revolution passes through the point C and is perpendicular to the third boundary line B3 and the fourth boundary line B4. In this specification, the body of revolution refers to a three-dimensional structure which is obtained by revolving a two-dimensional structure by 360° around a straight line which is present on the same plane as the two-dimensional structure. This straight line is referred to as "revolution axis".

As illustrated in the above embodiments, according to the present invention, a direct-viewing type liquid crystal display device is provided in which the frame is visually obscured and the display region can be altered into a transparent state. The display device may include a single liquid crystal display panel or may include a plurality of liquid crystal display panels which are combined together using a tiling technique.

Note that, in the illustrated liquid crystal display devices of the above embodiments, a liquid crystal display panel is used as the display panel, to which the present invention is not limited. For example, a double-sided emission type organic EL display device which is disclosed in Japanese Laid-Open Patent Publication No. 2005-326757 may be used.

INDUSTRIAL APPLICABILITY

The present invention is suitably applicable to a display device for display of information.

REFERENCE SIGNS LIST 10 liquid crystal display panel
10A display region
10B central display region
10D peripheral display region
10F frame region
10a display surface of display panel
10b side surface of display panel
11 upper substrate
12 lower substrate
13 liquid crystal layer
16 sealing portion
20 light-transmitting cover
22, 52 lens portion
22a, 52a front-side surface of lens portion
22c, 52c rear-side surface of lens portion
22d, 52d outer edge of lens portion
24, 54 flat portion
30 housing
36, 56 lateral housing portion
36a, 56a front-side surface of lateral housing portion
36b, 56b outer end surface of lateral housing portion
36c, 56c rear-side surface of lateral housing portion
40 backlight device
50 lens-integrated housing
50G panel vicinity portion
50H outer portion
38, 58 bottom housing portion
100A liquid crystal display device
101 region in which image is to be displayed
102 region in which frame is visually recognized
103 region in which rear environment is visible therethrough
D1 first direction
D2 second direction

The invention claimed is:

1. A direct-viewing type display device, comprising:
a display panel including a front side and a rear side, which includes a display region that can be altered into a transparent state in which light from a rear environment lying behind the display panel is allowed to pass through the display panel from the rear side to the front side such that the rear environment can be perceived by a viewer and a frame region provided outside the display region in a lateral direction; and
at least one light-transmitting cover which includes a first light-transmitting cover provided on the front side of the display panel; wherein
the first light-transmitting cover includes a lens portion positioned so as to selectively overlap only selective portions of the display panel including a region that includes a portion of the frame region of the display panel and a portion of a peripheral display region within the display region which adjoins the portion of the frame region;

the display device further includes a housing which includes a housing portion provided on a lateral side surface of the display panel;

at least some light going out from the portion of the peripheral display region and/or at least some light entering the housing portion on a rear side goes out on a front side of the housing portion; and an outermost lateral end surface of the housing portion is located at a position farther outward in the lateral direction than a corresponding outermost lateral edge of the lens portion of the first light-transmitting cover such that the outermost lateral end surface of the housing portion is not completely overlapped by the lens portion of the first light-transmitting cover.

2. A direct-viewing type display device, comprising:

a display panel including a front side and a rear side, which includes a display region that can be altered into a transparent state in which light from a rear environment lying behind the display panel is allowed to pass through the display panel from the rear side to the front side such that the rear environment can be perceived by a viewer and a frame region provided outside the display region; and at least one light-transmitting cover which includes a first light-transmitting cover provided on the front side of the display panel; wherein the first light-transmitting cover includes a lens portion positioned so as to overlap a region that includes a portion of the frame region of the display panel and a portion of a peripheral display region within the display region which adjoins the portion of the frame region;

the display device further includes a housing which includes a housing portion provided at least on a side surface of the display panel; and at least some light going out from the portion of the peripheral display region and/or at least some light entering the housing portion on a rear side goes out on a front side of the housing portion;

the housing portion is capable of transmitting light;

an outer end surface of the housing portion is located at an outer position relative to an outer edge of the lens portion of the first light-transmitting cover;

the housing and the first light-transmitting cover are integrally defined with one another by a single monolithic member;

the housing and the first light-transmitting cover are integrally provided, and at least a portion of both a front-side surface and a rear-side surface of the housing portion is a lens surface.

3. The display device of claim 2, wherein the housing portion is provided such that the front-side surface of the housing portion and the front-side surface of the lens portion define a boundary therebetween;

the boundary is located on a front side of the portion of the frame region; and the front-side surface of the housing portion is the lens surface.

4. A direct-viewing type display device, comprising:

a display panel having a front side and a rear side, which has a display region that can be altered into a transparent state in which light from a rear environment lying behind the display panel is allowed to pass through the display panel from the rear side to the front side such that the rear environment can be perceived by a viewer and a frame region provided outside the display region; and at least one light-transmitting cover which includes a first light-transmitting cover provided on the front side of the display panel; wherein the first light-transmitting cover includes a lens portion positioned so as to overlap a region that includes a portion of the frame region of the display panel and a portion of a peripheral display region within the display region which adjoins the portion of the frame region;

the display device further includes a housing which includes a housing portion provided at least on a side surface of the display panel; and at least some light going out from the portion of the peripheral display region and/or at least some light entering the housing portion on a rear side goes out on a front side of the housing portion;

the at least one light-transmitting cover further includes a second light-transmitting cover provided on a rear side of the display panel;

the second light-transmitting cover includes a lens portion positioned so as to overlap a region that includes the portion of the frame region of the display panel and the portion of a peripheral display region within the display region which adjoins the portion of the frame region; and at least some of the light going out from the portion of the peripheral display region and/or at least some of the light entering the housing portion on the front side goes out on a rear side of the housing portion.

5. The display device of claim 4, wherein the first light-transmitting cover and the second light-transmitting cover are arranged generally symmetrically about the display panel.

6. The display device of claim 5, wherein the first light-transmitting cover and the second light-transmitting cover have generally equal shapes.

7. The display device of claim 1, wherein the display panel is a polymer-dispersed liquid crystal display panel.

8. A direct-viewing type display device, comprising:

an organic EL display panel including a front side and a rear side, which includes a display region that can be altered into a transparent state in which light from a rear environment lying behind the organic EL display panel is allowed to pass through the organic EL display panel from the rear side to the front side such that the rear environment can be perceived by a viewer and a frame region provided outside the display region; and at least one light-transmitting cover which includes a first light-transmitting cover provided on the front side of the display panel; wherein the first light-transmitting cover includes a lens portion positioned so as to overlap a region that includes part of the frame region of the organic EL display panel and part of a peripheral display region within the display region which adjoins the part of the frame region, the display device further includes a housing which has a housing portion provided at least on a side surface of the organic EL display panel; and at least some light going out from the portion of the peripheral display region and/or at least some light entering the housing portion on a rear side goes out on a front side of the housing portion.

9. The display device of claim 2, wherein the display panel is a polymer-dispersed liquid crystal display panel.

10. The display device of claim 4, wherein the display panel is a polymer-dispersed liquid crystal display panel.

* * * * *